US010998025B2

(12) United States Patent
Manipatruni et al.

(10) Patent No.: US 10,998,025 B2
(45) Date of Patent: *May 4, 2021

(54) HIGH-DENSITY LOW VOLTAGE NON-VOLATILE DIFFERENTIAL MEMORY BIT-CELL WITH SHARED PLATE-LINE

(71) Applicant: Kepler Computing Inc., San Francisco, CA (US)

(72) Inventors: Sasikanth Manipatruni, Portland, OR (US); Rajeev Kumar Dokania, Beaverton, OR (US); Ramamoorthy Ramesh, Moraga, CA (US)

(73) Assignee: Kepler Computing, Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/287,876

(22) Filed: Feb. 27, 2019

(65) Prior Publication Data

US 2020/0273865 A1    Aug. 27, 2020

(51) Int. Cl.
*G11C 11/22* (2006.01)
*H01L 27/11502* (2017.01)
(Continued)

(52) U.S. Cl.
CPC ........ *G11C 11/221* (2013.01); *G11C 11/2255* (2013.01); *G11C 11/2257* (2013.01);
(Continued)

(58) Field of Classification Search
CPC ......... H01L 27/11502; H01L 27/11507; G11C 11/221; G11C 11/2257; G11C 11/2255
See application file for complete search history.

(56) References Cited

U.S. PATENT DOCUMENTS

| 5,760,432 A | 6/1998 | Abe et al. |
| 6,043,526 A | 3/2000 | Ochiai |

(Continued)

FOREIGN PATENT DOCUMENTS

| TW | 200718237 | 5/2007 |
| TW | 200935151 | 8/2009 |

(Continued)

OTHER PUBLICATIONS

Chandler, T., "An adaptive reference generation scheme for 1T1C FeRAMs", 2003 Symposium on VLSI Circuits. Digest of Technical Papers (IEEE Cat. No. 03CH37408), Kyoto, Japan, 2003, pp. 173-174.

(Continued)

*Primary Examiner* — Grant S Withers
(74) *Attorney, Agent, or Firm* — Green, Howard & Mughal LLP

(57) ABSTRACT

Described is a low power, high-density non-volatile differential memory bit-cell. The transistors of the differential memory bit-cell can be planar or non-planer and can be fabricated in the frontend or backend of a die. A bit-cell of the non-volatile differential memory bit-cell comprises first transistor first non-volatile structure that are controlled to store data of a first value. Another bit-cell of the non-volatile differential memory bit-cell comprises second transistor and second non-volatile structure that are controlled to store data of a second value, wherein the first value is an inverse of the second value. The first and second volatile structures comprise ferroelectric material (e.g., perovskite, hexagonal ferroelectric, improper ferroelectric).

24 Claims, 15 Drawing Sheets

(51) Int. Cl.
*H01L 21/02* (2006.01)
*H01L 27/11507* (2017.01)
*H01L 49/02* (2006.01)

(52) U.S. Cl.
CPC .. *H01L 21/02197* (2013.01); *H01L 27/11502* (2013.01); *H01L 27/11507* (2013.01); *H01L 28/55* (2013.01); *H01L 28/75* (2013.01); *H01L 28/90* (2013.01); *G11C 11/225* (2013.01)

(56) References Cited

U.S. PATENT DOCUMENTS

| | | | |
|---|---|---|---|
| 6,346,741 | B1 | 2/2002 | Buskirk et al. |
| 6,500,678 | B1 * | 12/2002 | Aggarwal ............... C23C 14/08 257/E21.009 |
| 6,587,367 | B1 * | 7/2003 | Nishimura ............... G11C 7/14 365/145 |
| 6,656,748 | B2 | 12/2003 | Hall et al. |
| 6,713,342 | B2 | 3/2004 | Celii et al. |
| 6,720,600 | B2 | 4/2004 | Okita |
| 6,728,128 | B2 | 4/2004 | Nishimura et al. |
| 7,029,925 | B2 | 4/2006 | Celii et al. |
| 2002/0153550 | A1 | 10/2002 | An et al. |
| 2003/0119211 | A1 * | 6/2003 | Summerfelt ............ H01L 28/60 438/3 |
| 2003/0129847 | A1 | 7/2003 | Celii et al. |
| 2004/0104754 | A1 | 6/2004 | Bruchhaus et al. |
| 2004/0129961 | A1 | 7/2004 | Paz de Araujo et al. |
| 2005/0012126 | A1 * | 1/2005 | Udayakumar .......... H01L 28/57 257/295 |
| 2005/0214954 | A1 * | 9/2005 | Maruyama ........ H01L 27/11507 438/3 |
| 2005/0230725 | A1 * | 10/2005 | Aggarwal ............... H01L 28/75 257/295 |
| 2005/0244988 | A1 * | 11/2005 | Wang ...................... H01L 28/65 438/3 |
| 2006/0001070 | A1 | 1/2006 | Park et al. |
| 2006/0006447 | A1 | 1/2006 | Kim et al. |
| 2006/0073613 | A1 | 4/2006 | Aggarwal et al. |
| 2006/0073614 | A1 | 4/2006 | Hara |
| 2006/0134808 | A1 | 6/2006 | Summerfelt et al. |
| 2006/0258113 | A1 | 11/2006 | Sandhu et al. |
| 2007/0298521 | A1 | 12/2007 | Obeng et al. |
| 2008/0073680 | A1 | 3/2008 | Wang |
| 2008/0081380 | A1 * | 4/2008 | Celii .................. H01L 27/11507 438/3 |
| 2008/0107885 | A1 | 5/2008 | Alpay et al. |
| 2008/0191252 | A1 | 8/2008 | Nakamura et al. |
| 2009/0003042 | A1 | 1/2009 | Lee et al. |
| 2015/0069481 | A1 * | 3/2015 | Sun .................. H01L 27/11502 257/295 |
| 2015/0294702 | A1 | 10/2015 | Lee et al. |
| 2018/0286987 | A1 | 10/2018 | Lee et al. |
| 2018/0323309 | A1 | 11/2018 | Ando et al. |
| 2019/0051815 | A1 | 2/2019 | Kakinuma et al. |
| 2019/0115353 | A1 | 4/2019 | O'Brien et al. |
| 2019/0138893 | A1 * | 5/2019 | Sharma ................ G06N 3/0635 |
| 2020/0004583 | A1 | 1/2020 | Kelly et al. |

FOREIGN PATENT DOCUMENTS

| | | |
|---|---|---|
| TW | 201725736 | 7/2017 |
| WO | 2013147295 | 10/2013 |
| WO | 2015167887 | 11/2015 |

OTHER PUBLICATIONS

Jung, D. et al., "Highly manufacturable 1T1C 4 Mb FRAM with novel sensing scheme," International Electron Devices Meeting 1999. Technical Digest (Cat. No. 99CH36318), Washington, DC, USA, 1999, pp. 279-282., International Electron Devices Meeting 1999. Technical Digest (Cat. No. 99CH36318), Washington, DC, USA, 1999, pp. 279-282.

Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.

Oh, S. et al., "Noble FeRAM technologies with MTP cell structure and BLT ferroelectric capacitors", IEEE International Electron Devices Meeting 2003, Washington, DC, USA, 2003, pp. 34.5.1-34.5.4.

Tanaka, S. et al., "FRAM cell design with high immunity to fatigue and imprint for 0.5 /spl mu/m 3 V 1T1C 1 Mbit FRAM", in IEEE Transactions on Electron Devices, vol. 47, No. 4, pp. 781-788, Apr. 2000.

Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.

1st Office Action dated Dec. 11, 2020 for Taiwan Patent Application No. 109106095.

Run-Lan et al., "Study on Ferroelectric Behaviors and Ferroelectric Nanodomains of YMno3 Thin Film", Acta Phys. Sin. vol. 63, No. 18 (2014). Supported by the National Natural Science Foundation of China. DOI: 10.7498/aps.187701. 6 pages.

International Search Report & Written Opinion dated Jun. 19, 2020 for U.S. Patent Application No. PCT/US2020/018879.

International Search Report & Written Opinion dated Jun. 24, 2020 for PCT Patent Application No. PCT/US2020/018870.

Non-Final Office Action dated Aug. 5, 2020 for U.S. Appl. No. 16/287,953.

Non-Final Office Action dated Aug. 5, 2020 for U.S. Appl. No. 16/288,004.

Non-Final Office Action dated Aug. 5, 2020 for U.S. Appl. No. 16/288,006.

Notice of Allowance dated Jul. 27, 2020 for U.S. Appl. No. 16/287,927.

* cited by examiner

HIGH-DENSITY LOW VOLTAGE NON-VOLATILE DIFFERENTIAL MEMORY BIT-CELL WITH SHARED PLATE-LINE

BACKGROUND

The standard memory used in processors is static random access memory (SRAM) or dynamic random access memory (DRAM), and their derivatives. These memories are volatile memories. For example, when power to the memories is turned off, the memories lose their stored data. Non-volatile memories are now also commonly used in computing platforms to replace magnetic hard disks. Non-volatile memories retain their stored data for prolonged periods (e.g., months, years, or forever) even when power to those memories is turned off. Examples of non-volatile memories are magnetic random access memory (MRAM), NAND or NOR flash memories. These memories may not be suitable for low power and compact computing devices because these memories suffer from high write energy, low density, and high power consumption.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
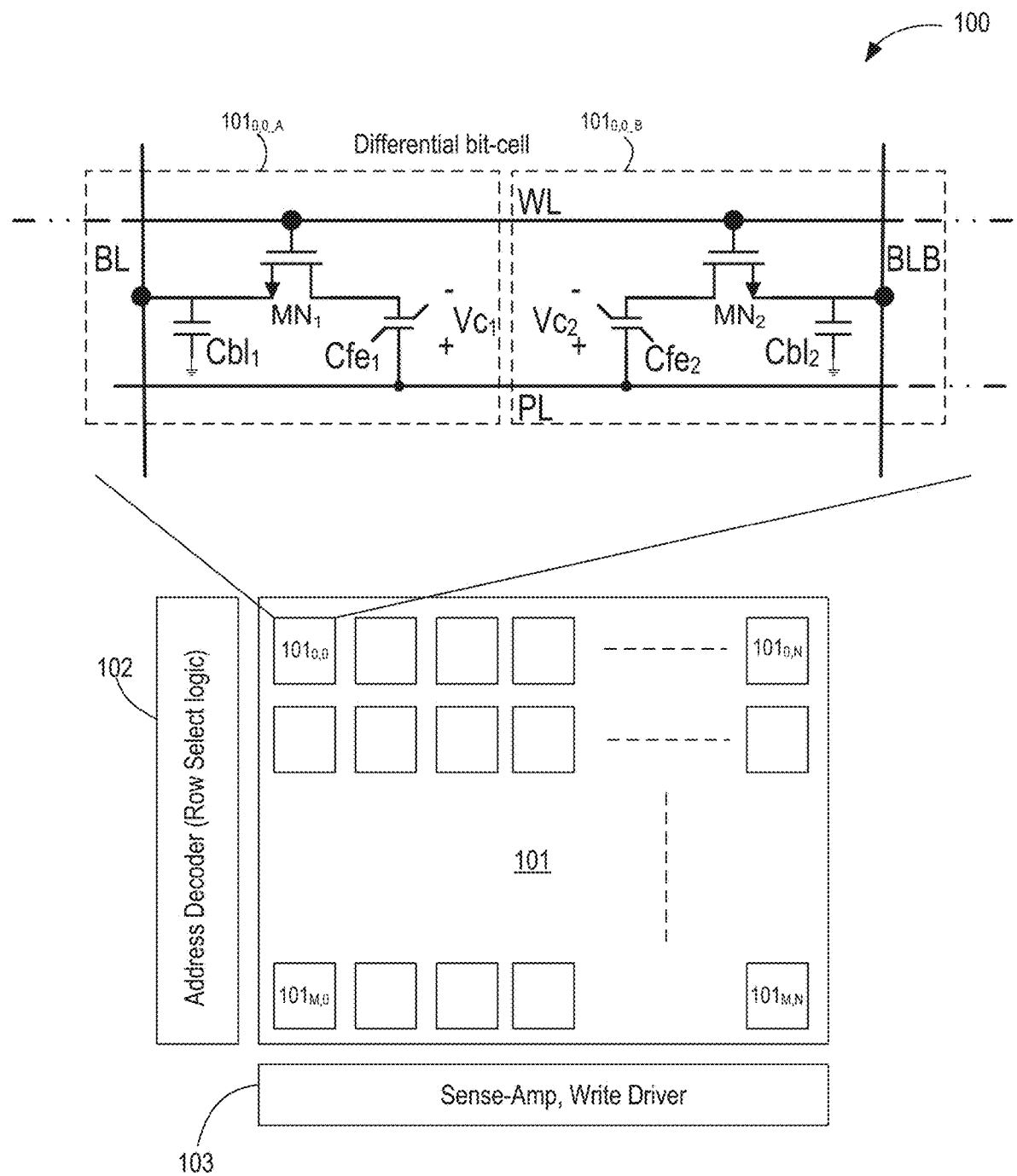
FIG. 1A illustrates an apparatus comprising memory and corresponding logic, wherein the memory comprises differential ferroelectric (FE) memory bit-cells, in accordance with some embodiments.

Typical ferroelectric (FE) capacitors suffer from asymmetry in the switching voltages for positive and negative polarity. This is due to the spatial migration of the atoms from/to the electrode from the ferroelectrics, when the population of 1s and 0s are imbalanced. This makes the use of typical FE capacitors challenging for memory bit-cells because writing 0s or 1s to the FE capacitor may need different energies, which creates an overhead for circuit design.

Some embodiments describe a low power, high-density non-volatile differential memory bit-cell that compensates for the asymmetry of typical ferroelectric capacitors. The transistors of the differential memory bit-cell can be planar or non-planar and can be fabricated in the frontend or backend of a die. A bit-cell of the non-volatile differential memory bit-cell comprises first transistor and first non-volatile structure that are controlled to store data of a first value. Another bit-cell of the non-volatile differential memory bit-cell comprises second transistor and second non-volatile structure that are controlled to store data of a second value, wherein the first value is an inverse of the second value. The first and second volatile structures comprise low voltage ferroelectric material (e.g., perovskite material, hexagonal ferroelectric, or improper ferroelectric) that can switch its state by small voltage change (e.g., 100 mV).

In some embodiments, the each of the first and second non-volatile structures comprise: a first layer comprising a first refractive inter-metallic material, wherein the first layer is adjacent to the drain or source of the first or second transistor. Examples for first refractive inter-metallic material include: Ti—Al such as Ti3Al, TiAl, TiAl3; Ni—Al such as Ni3Al, NiAl3, Ni—Al; Ni—Ti, Ni—Ga, Ni2MnGa; FeGa, Fe3Ga; borides, carbides, or nitrides. In some embodiments, the refractive inter-metallic material is part of a barrier layer which is a super lattice of a first material and a second material, wherein the first material includes Ti and Al (e.g., Ti—Al) and the second material includes Ta, W, and Co (e.g., layers of Ta, W, and Co together). In various embodiments, the lattice parameters of the barrier layer is matched with the lattice parameters of the conductive oxides and/or the FE material. In some embodiments, the first and second non-volatile structures comprise a second layer comprising a first conductive oxide, wherein the second layer is adjacent to the first layer. The first and second non-volatile structures comprise a third layer comprising an FE material, wherein the third layer is adjacent to the second layer.

The FE material can be any suitable low voltage FE material that allows the FE material to switch its state by a low voltage (e.g., 100 mV). In some embodiments, the FE material comprises a perovskite material of the type ABO3, where 'A' and 'B' are two cations of different sizes, and 'O' is oxygen which is an anion that bonds to both the cations. Generally, the size of atoms of A is larger than the size of B atoms. In some embodiments, the perovskite material can be doped (e.g., by La or Lanthanides). In various embodiments, when the FE material is a perovskite material, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In various embodiments, when the FE material comprises hexagonal ferroelectrics, the conductive oxides are of A2O3 (e.g., In2O3, Fe2O3) and ABO3 type, where A is a rare element.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. For example, the pillar capacitor of various embodiments can be formed using paraelectric material instead of ferroelectric material.

In some embodiments, the first and second non-volatile structures comprise a fourth layer comprising a second conductive oxide, wherein the fourth layer is adjacent to the third layer. The first and second non-volatile structures comprise a fifth layer comprising a second refractive intermetallic material, wherein the fifth layer is adjacent to the PL and adjacent to the fourth layer. In some embodiments, the first and second non-volatile structures comprise a sixth layer adjacent to a first side of the first, second, third, fourth and fifth layers. The first and second non-volatile structures also comprise a seventh layer adjacent to a second side of the first, second, third, fourth and fifth layers, wherein the sixth and the seventh layers comprise a sidewall barrier material (e.g., Ti—Al—O, Al2O3, or MgO). The sidewall barrier material is an insulating material.

There are many technical effects of the various embodiments. For example, the differential FE memory bit-cell compensates for the inherent asymmetry in the FE material. Over the time of operation, FE memory cells suffer from asymmetry in the switching voltages for positive and negative polarity. This is due to the spatial migration of the atoms from/to the electrode from the FE, when the population of 1s and 0s are imbalanced. By operating the first and second FE capacitive structures such that data stored in the first FE capacitive structure is a complement to the data stored on the second FE capacitive structure, asymmetry in the FE cells is compensated. The differential FE memory bit-cell results in a compact layout for high-density memory realization. The differential FE memory bit-cell with compensated FE asymmetry allows for high integrity artificial intelligence (AI) processing at low power. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right." "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1A illustrates apparatus 100 comprising memory 101 and corresponding logic 102 and 103, wherein the memory comprises differential FE memory bit-cells, in accordance with some embodiments. Logic 102 comprises address decoders for selecting a row of bit-cells and/or a particular bit-cell from an M×N array, where M and N are integers of same or different values. Logic 103 comprises sense-amplifiers for reading the values from the selected bit-cell, while write drivers are used to write a particular value to a selected differential bit-cell. Here, a schematic of differential bit-cell $101_{0,0}$ is illustrated. The same embodiments apply to other bit-cells of the M×N array.

In some embodiments, differential bit-cell $101_{0,0}$ comprises a word-line (WL), a plate-line (PL), a bit-line (BL), a complementary bit-line (BLB), and two half bit-cells $101_{0,0\_A}$ and $101_{0,0\_B}$. In some embodiments, first half bit-cell $101_{0,0\_A}$ comprises an n-type transistor $MN_1$, and FE capacitive structure $Cfe_1$. In some embodiments, second half bit-cell $101_{0,0\_B}$ comprises an n-type transistor $MN_2$ and FE capacitive structure $Cfe_2$. The gates of transistors $MN_1$ and $MN_2$ share a common WL. In various embodiments, one terminal of first and second FE capacitive structures ($Cfe_1$ and $Cf_2$) is coupled a common PL. The second terminal of the first and second FE capacitive structures ($Cfe_1$ and $Cf_2$) is coupled to source or drain terminals of respective transistors.

For example, the second terminal of $Cfe_1$ is coupled to the drain or source terminal of transistor $MN_1$, while the second terminal of $Cfe_2$ is coupled to the drain or source terminal of transistor $MN_2$. In various embodiments, BL is coupled to the source or drain terminal of the first transistor $MN_1$ of the first half-cell $101_{0,0\_A}$, while BLB is coupled to the source or drain terminal of the second transistor $MN_2$ of the first half-cell $101_{0,0\_B}$. In some embodiments, a first BL capacitor $CBl_1$ is coupled to the source or drain terminal of first transistor $MN_1$ and to a reference node (e.g., ground), while a second BL capacitor $CBl_2$ is coupled to the source or drain terminal of second transistor MN$_2$ and to the reference node such that the FE capacitor is not coupled to the same source or drain terminal.

In various embodiments, half bit-cells $101_{0,0\_A}$ and $101_{0,0\_B}$ are self-referenced cells due to their proximal location with respect to one another. For example, the static spatial process variations are common mode for Cfe$_1$ and Cfe$_2$ of half bit-cells $101_{0,0\_A}$ and $101_{0,0\_B}$, respectively. Here, BL and BLB generate opposite polarity sensing signals. At first use of the differential memory bit-cell, assume the critical voltages on the FE capacitors Cfe$_1$ and Cfe$_2$ are of the following sequence: +VFe1, +VFe2, −VFe1, −VFe2 critical switching voltages, where +VFe1=+VFe2, −Vfe1=−vfe2 at the first operation of the memory. When the operation of the memory leads to a symmetric switching voltages, +VFe1+DF1, −VFe1+DF1, +VFe2+DF1, −VFe2+DF1, the total switching voltage of half bit-cells $101_{0,0\_A}$ and $101_{0,0\_B}$, remains (+VFe1+DF1)−(−VFe2+DF1)=VFe1+VFe2, allowing for self-compensation of the asymmetry, where DF1 is the offset due to asymmetry. This offset is added to the hysteresis of the behavior of the FE material.

Figure 1B:
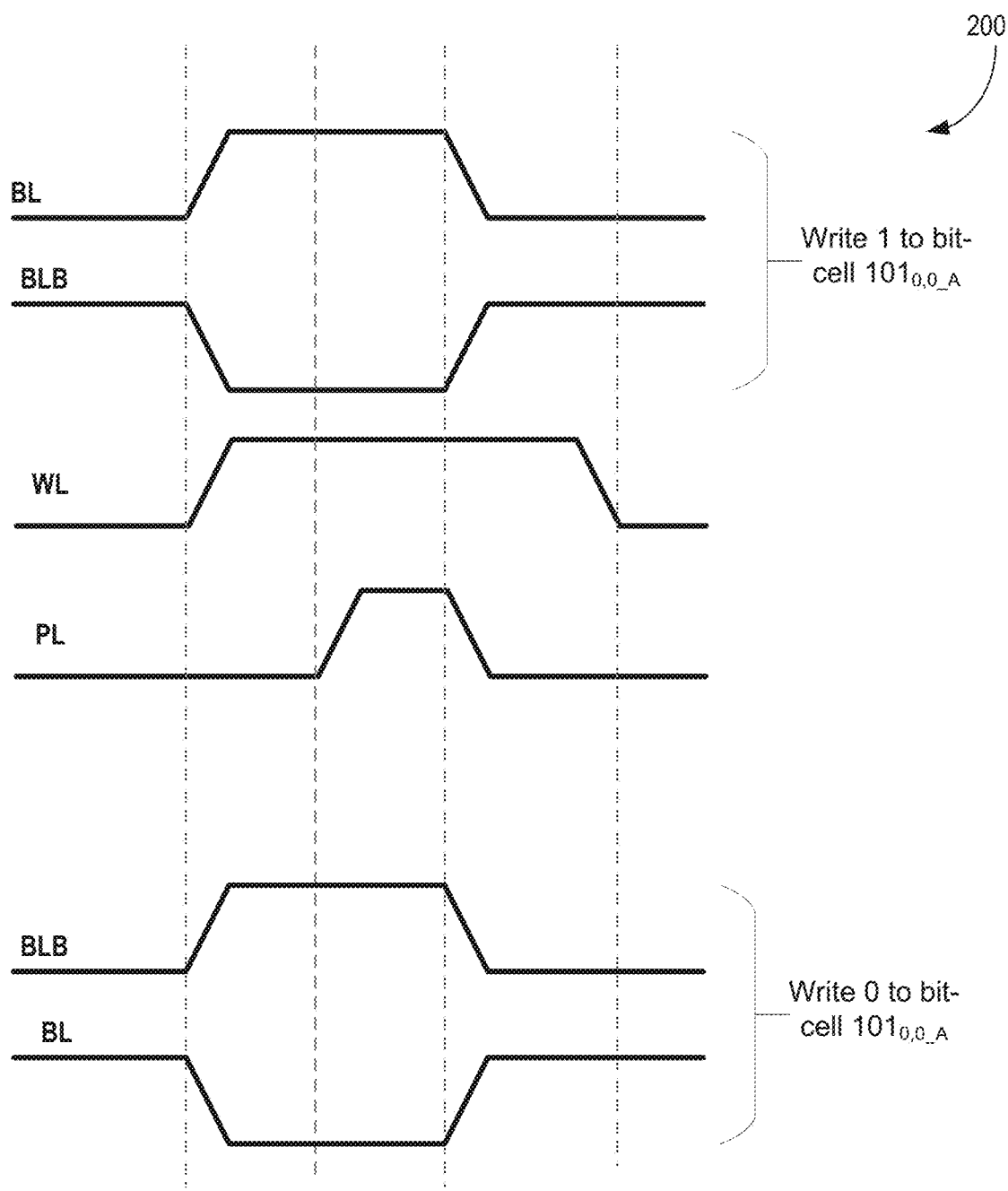
FIG. 1B illustrates a timing diagram for writing a logic 1 and logic 0 to the differential bit-cell, in accordance with some embodiments.

FIG. 1B illustrates timing diagram 200 for writing a logic 1 and logic 0 to the differential bit-cell, in accordance with some embodiments. To write data to the differential bit-cell, BL, PL, and BLB generate a signal sequence to write opposite polarity to half bit-cells $101_{0,0\_A}$ and $101_{0,0\_B}$. For example, if logic 1 is written to half bit-cells $101_{0,0\_A}$ then logic 0 is written to half bit-cells $101_{0,0\_B}$, as illustrated in timing diagram 200. The signal scheme for sensing the data in the differential bit-cell is similar to a sensing scheme for an SRAM (static random access memory). While the various embodiments are illustrated using n-type transistors, the differential bit-cell can also be implemented using p-type transistors.

Figure 2A:
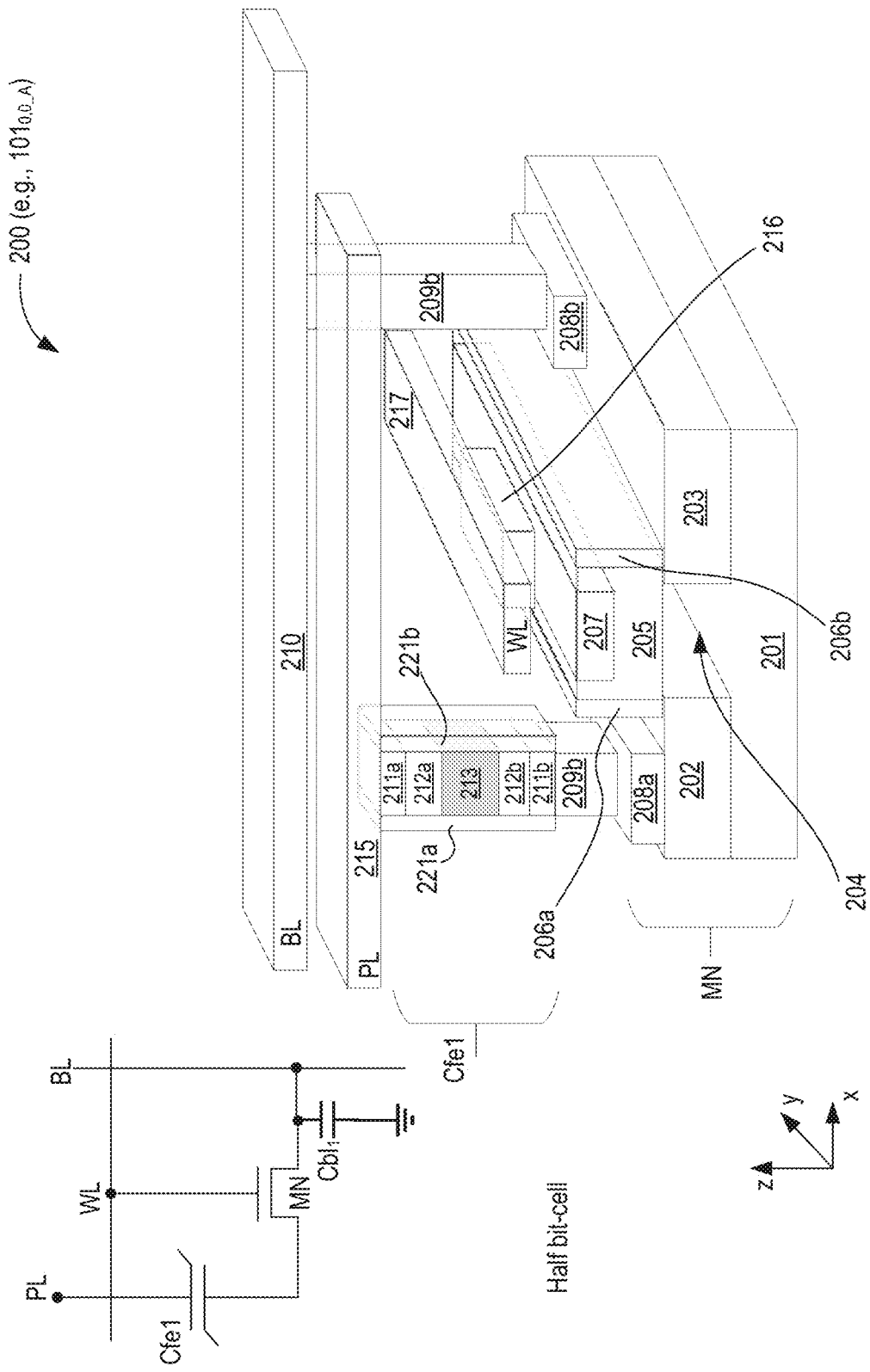
FIG. 2A illustrates a three-dimensional (3D) view of a half bit-cell of the differential FE memory bit-cell comprising a planar transistor, in accordance with some embodiments.

FIG. 2A illustrates 3D view 200 of a half bit-cell of the differential FE memory bit-cell comprising a planar transistor, in accordance with some embodiments. The memory bit-cell includes a planar transistor MN having substrate 201, source 202, drain 203, channel region 204, gate dielectric 205, gate spacers 206a and 206b; gate metal 207, source contact 208a, and drain contact 208b.

Substrate 201 includes a suitable semiconductor material such as: single crystal silicon, polycrystalline silicon and silicon on insulator (SOD. In one embodiment, substrate 201 includes other semiconductor materials such as: Si, Ge, SiGe, or a suitable group III-V or group III-N compound. The substrate 201 may also include semiconductor materials, metals, dopants, and other materials commonly found in semiconductor substrates.

In some embodiments, source region 202 and drain region 203 are formed within substrate 201 adjacent to the gate stack of the transistor. The source region 202 and drain region 203 are generally formed using either an etching/deposition process or an implantation/diffusion process.

In the etching/deposition process, substrate 201 may first be etched to form recesses at the locations of the source 202 and drain 203 regions. An epitaxial deposition process may then be carried out to fill the recesses with material that is used to fabricate the source region 202 and drain region 203. In the implantation/diffusion process, dopants such as boron, aluminum, antimony, phosphorous, or arsenic may be ion-implanted into the substrate to form the source region 202 and drain region 203. An annealing process that activates the dopants and causes them to diffuse further into substrate 201 typically follows the ion-implantation process.

In some embodiments, one or more layers of metal and/or metal alloys are used to form the source region 202 and drain region 203. In some embodiments, source region 202 and drain region 203 are formed using one or more alternate semiconductor materials such as germanium or a suitable group III-V compound. In some embodiments, source region 202 and drain region 203 are fabricated using a silicon alloy such as silicon germanium or silicon carbide. In some embodiments, the epitaxially deposited silicon alloy is doped in-situ with dopants such as boron, arsenic, or phosphorous.

The semiconductor material for channel region 204 may have the same material as substrate 201, in accordance with some embodiments. In some embodiments, channel region 204 includes one of: Si, SiGe, Ge, and GaAs.

The gate dielectric layer 205 may include one layer or a stack of layers. The one or more layers may include high-k dielectric material, silicon oxide, and/or silicon dioxide (SiO$_2$). The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide. In some embodiments, when a high-k material is used, an annealing process is used on the gate dielectric layer 205 to improve its quality.

In some embodiments, a pair of spacer layers (sidewall spacers) 206a/b are formed on opposing sides of the gate stack that bracket the gate stack. The pair of spacer layers 206a/b are formed from a material such as: silicon oxynitride, silicon nitride, silicon nitride doped with carbon, or silicon carbide. Processes for forming sidewall spacers are well-known in the art and generally include deposition and etching process operations. In some embodiments, a plurality of spacer pairs may be used. For example, two pairs, three pairs, or four pairs of sidewall spacers may be formed on opposing sides of the gate stack.

Gate metal layer 207 may comprise at least one P-type work-function metal or N-type work-function metal, depending on whether the transistor is to be a p-type or an n-type transistor. Gate metal layer 207 may comprise a stack of two or more metal layers, where one or more metal layers are work-function metal layers and at least one metal layer is a conductive fill layer.

For an n-type transistor, metals that may be used for the gate metal layer 207 include: aluminum carbide, tantalum carbide, zirconium carbide, and hafnium carbide. In some embodiments, metal for gate metal layer 207 for n-type transistor include: aluminum, hafnium, zirconium, titanium, tantalum, and their alloys. An n-type metal layer will enable the formation of an n-type gate metal layer 207 with a work function that is between about 3.9 eV and about 4.2 eV. In some embodiments, metal of layer 207 includes one of: TiN, TiSiN, TaN, Cu, Al, Au, W, TiSiN, or Co. In some embodiments, metal of layer 107 includes one or more of: Ti, N, Si, Ta, Cu, Al, Au, W, or Co.

For a p-type transistor, metals that are used for gate metal layer 207 include, but are not limited to, ruthenium, palladium, platinum, cobalt, nickel, and conductive metal oxides. An example of conductive oxide includes ruthenium oxide. A p-type metal layer will enable the formation of a p-type gate metal layer 207 with a work function that is between about 4.9 eV and about 5.2 eV.

The drain contact 208b is coupled to via 209a, which is coupled to metal layer 210. Metal layer 210 is the bit-line, which extends along the x-axis. The source contact 208a is coupled to via 209b. Any suitable material can be used for drain and source contacts 208a/n and via 209a/b. For example, one or more of Ti, N, Si, Ta, Cu, Al, Au, W, or Co can be used for drain and source contacts 208a/n and via 209a/b. Via 209b is coupled to FE capacitor $Cfe_1$ that comprises refractive inter-metallic material 211a/b as a barrier material; conductive oxides 212a/bb, and FE material 213.

Refractive inter-metallic material 211a/b maintains the FE properties of the FE capacitor $Cfe_1$. In the absence of refractive inter-metallic material 211a/b, the ferroelectric material or the paraelectric material 213 of the capacitor may lose its potency. In some embodiments, refractive inter-metallic material 211a/b comprises Ti and Al (e.g., TiAl compound). In some embodiments, refractive inter-metallic material 211a/b comprises one or more of Ta, W, and/or Co.

For example, refractive inter-metallic material 211a/b includes a lattice of Ta, W, and Co. In some embodiments, refractive inter-metallic material 211a/b includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. Barrier layer 211a is coupled to plate-line or power-line (PL) 215.

In various embodiments, PL 215 extends along the x-direction and parallel to the BL 110. Having the BL and the PL parallel to one another further improves the density of the memory because the memory bit-cell footprint reduces compared to the case when BL and PL are orthogonal to each other. The gate metal 207 is coupled to a gate contact 216, which is coupled to a metal line 217. Metal line 217 is used as the word-line (WL). In some embodiments, WL 217 extends orthogonal to BL 210 and PL 115. In some embodiments, WL 217 is also parallel to BL 210 and PL 215. Any suitable metal can be used for BL 210, PL 215, and WL 217. For example, Al, Cu, Co, Au, or Ag can be used for BL 210, PL 215, and WL 217.

In some embodiments, FE material 213 is perovskite material, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc. may be used for FE material 213. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3-2%. For chemically substituted BiFeO3, BrCrO3, BuCoO3 class of materials, La or rate earth substitution into the Bi site can tune the spontaneous distortion.

In various embodiments, when metallic perovskite material is used for FE material 213, conductive oxides 112a/b can include one or more of: $IrO_2$, $RuO_2$, $PdO_2$, $OsO_2$, or $ReO_3$. In some embodiments, the perovskite material is doped with La or Lanthanides. In some embodiments, thin layer (e.g., approximately 10 nm) perovskite material template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as conductive oxides 212a/b.

In some embodiments, FE material 213 comprises hexagonal ferroelectrics of the type AMnO3. In various embodiments, when FE material 213 comprises hexagonal ferroelectrics, the conductive oxides are of $ABO_3$ type, where A is a rare earth metal. Examples of hexagonal metals used as conductive oxides 212a/b include one or more of: PtCoO2, PdCoO2, and other delafossite structured hexagonal metallic oxides such as Al doped ZnO.

In some embodiments, FE material 213 comprises improper FE material. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. Other examples of conductive oxides include spinels such as Fe3O4, LiV2O4, and cubic metal oxides such as ITO (indium tin oxide), Sn doped In2O3. In some embodiments, BL 210 is made wide and tall enough to provide parasitic capacitance comparable to Cbl1. In various embodiments, sidewall barrier material 221a/b (e.g., Ti—Al—O, Al2O3, or MgO) as shown in FIG. 2C is formed along the sides of the FE capacitor structure. The sidewall barrier material is an insulating material (e.g., a non-conductive material).

While various embodiments here are described with reference to ferroelectric material for storing the charge state, the embodiments are also applicable for paraelectric material. For example, material 213 of various embodiments can be formed using paraelectric material instead of ferroelectric material.

Figure 2B:
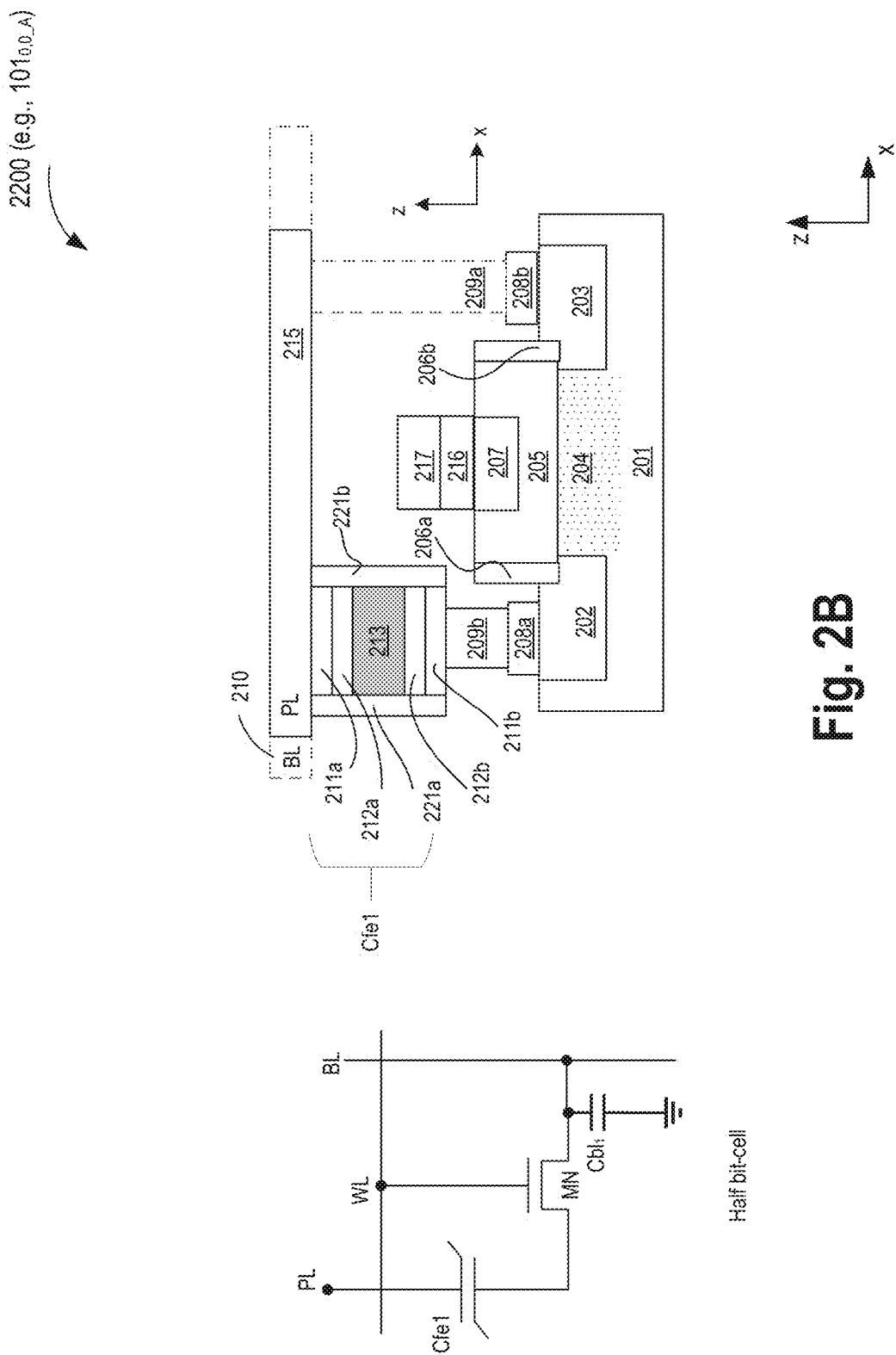
FIG. 2B illustrates a cross-sectional view of the half bit-cell of the differential FE memory bit-cell of FIG. 2A, in accordance with some embodiments.
Figure 2C:
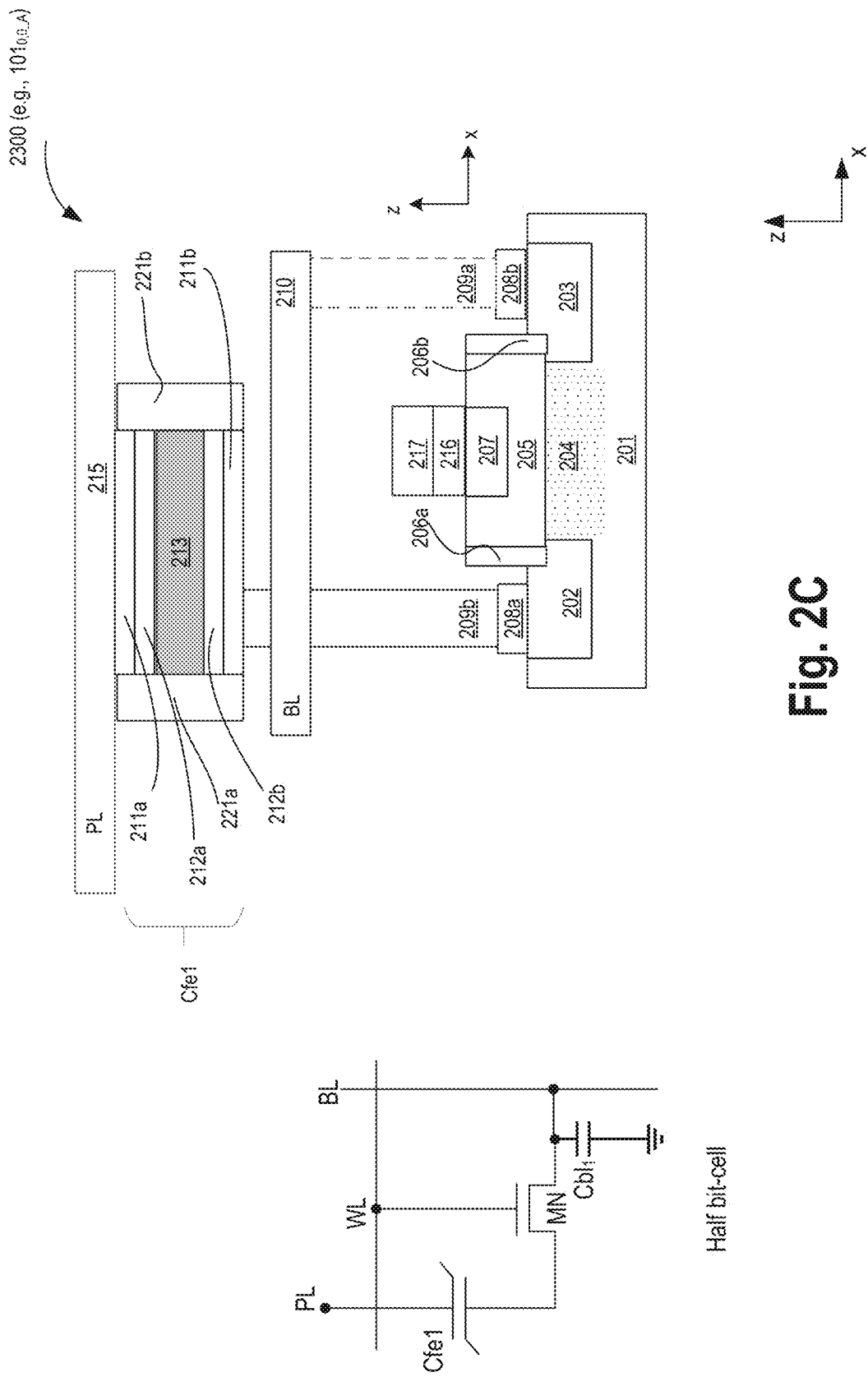
FIG. 2C illustrates a cross-sectional view of the differential FE memory bit-cell of FIG. 1, wherein the FE capacitive structure is positioned above the bit-line, in accordance with some embodiments.

FIG. 2B illustrates cross-sectional view 2200 of the half bit-cell of the differential FE memory bit-cell of FIG. 2B, in accordance with some embodiments.

FIG. 2C illustrates cross-section view 2300 of the differential FE memory bit-cell of FIG. 1, wherein the FE capacitive structure is positioned above the bit-line, in accordance with some embodiments. This embodiment allows for using the space between BL and PL for forming the FE capacitor structure.

Figure 2D:
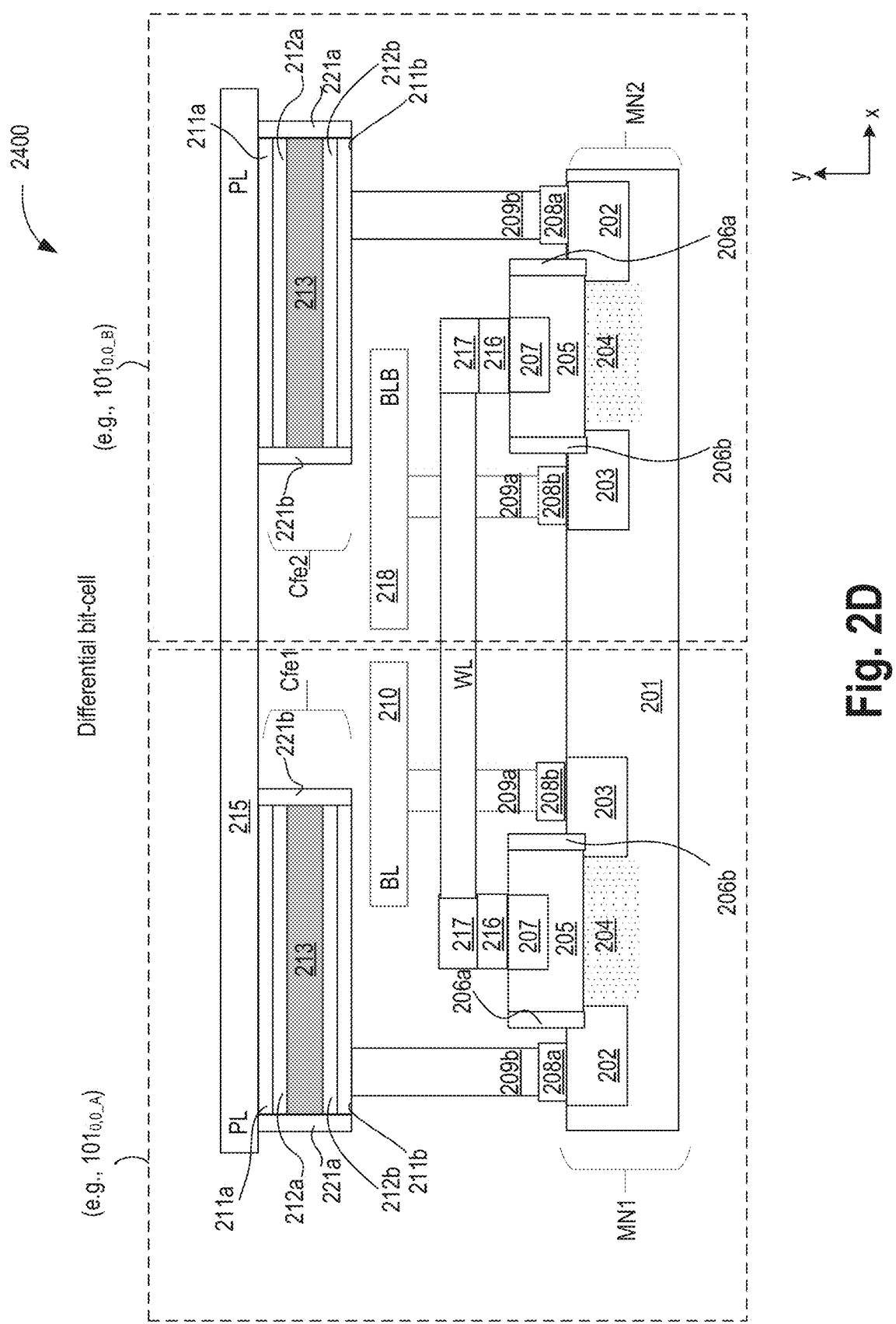
FIG. 2D illustrates a cross-sectional view of the differential FE memory bit-cell of FIG. 1, in accordance with some embodiments.

FIG. 2D illustrates cross-section view 2400 of the differential FE memory bit-cell of FIG. 1, in accordance with some embodiments. In some embodiments, the two half bit-cells $101_{0,0\_A}$ and $101_{0,0\_B}$ are mirror image of one another to achieve matching in device characteristics and to achieve differential behavior in bit-cell to compensate for asymmetry in the FE material. PL 215 and WL 217 is shared by the two bit-cells. Here, BLB is labeled as 218.

Figure 2E:
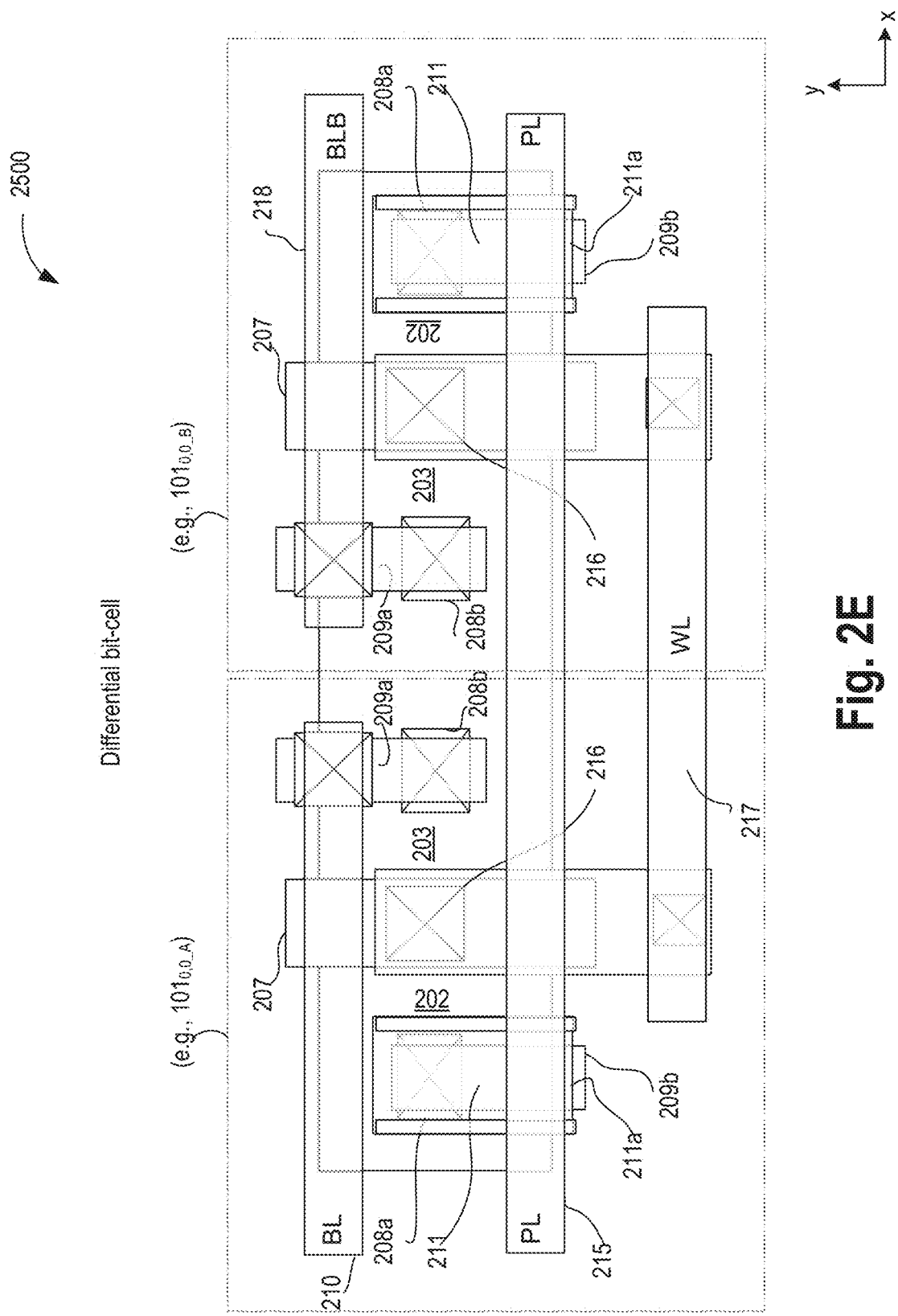
FIG. 2E illustrates a layout of the differential FE memory bit-cell of FIG. 2C, in accordance with some embodiments.

FIG. 2E illustrates layout 2500 of the differential FE memory bit-cell of FIG. 2C, in accordance with some embodiments. The pitch of the bit-cell layout 2400 is approximately the pitch of two transistor areas. Here, pitch refers to the x and y dimensions of the bit-cell. Because of the small pitch, many bit-cells can be packed in an array fashion leading to a high-density memory array, which is compensated for FE asymmetry.

While the capacitive structure of various embodiments is shown as a rectangular structure, it can have other shapes too. For example, the capacitive structure of various embodiments can have a cylindrical shape with dimensions similar to the one described with reference to the rectangular capacitive structure.

Figure 3:
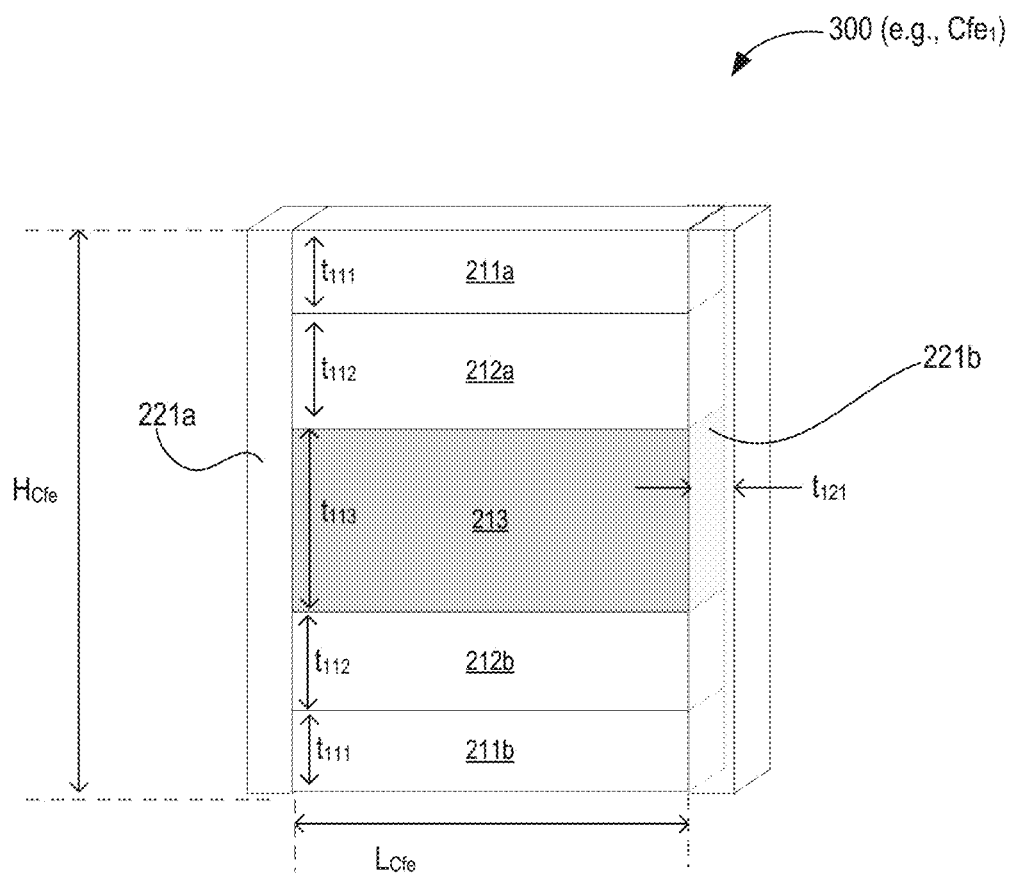
FIG. 3 illustrates a 3D view of the FE capacitive structure, in accordance with some embodiments.
Figure 3:
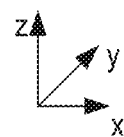

FIG. 3 illustrates 3D view 300 of the FE capacitive structure, in accordance with some embodiments. Materials for various layers are discussed with reference to FIG. 2A. In some embodiments, thickness $t_{111}$ of refractive inter-metallic material layer 211a/b is in a range of 1 nm to 20 nm. In some embodiments, thickness $t_{112}$ of the conductive oxide layers 212a/b is in a range of 1 nm to 20 nm. In some embodiments, thickness $t_{113}$ of the FE material (e.g., perovskite material, hexagonal ferroelectric, or improper ferroelectric) 213a/b is in a range of 1 nm to 20 nm. In some embodiments, the lateral thickness $t_{121}$ of the sidewall barrier seal 221a/b (insulating material) is in a range of 0.1 nm to 20 nm. In some embodiments, the lateral thickness $L_{Cfe}$ of the capacitive structure (without sidewall barrier) is in a range of 5 nm 200 nm. In some embodiments, the height $H_{Cfe}$ of the capacitive structure is in a range of 10 nm 200 nm. In some embodiments, the FE capacitive structure is without refractive inter-metallic material layers 211a/b. In that case, conductive oxides layers 212a/b are in direct contact with the contacts, vias, or metals (e.g., PL, source/drain region contact of transistor MN). In some embodiments, sidewall barrier seal 221a/b is not present. In one such embodiment, the sidewalls of the layers 211a/b, 212a/n, and 213 are in direct contact with ILD (interlayer dielectric) such as SiO2.

Figure 4A:
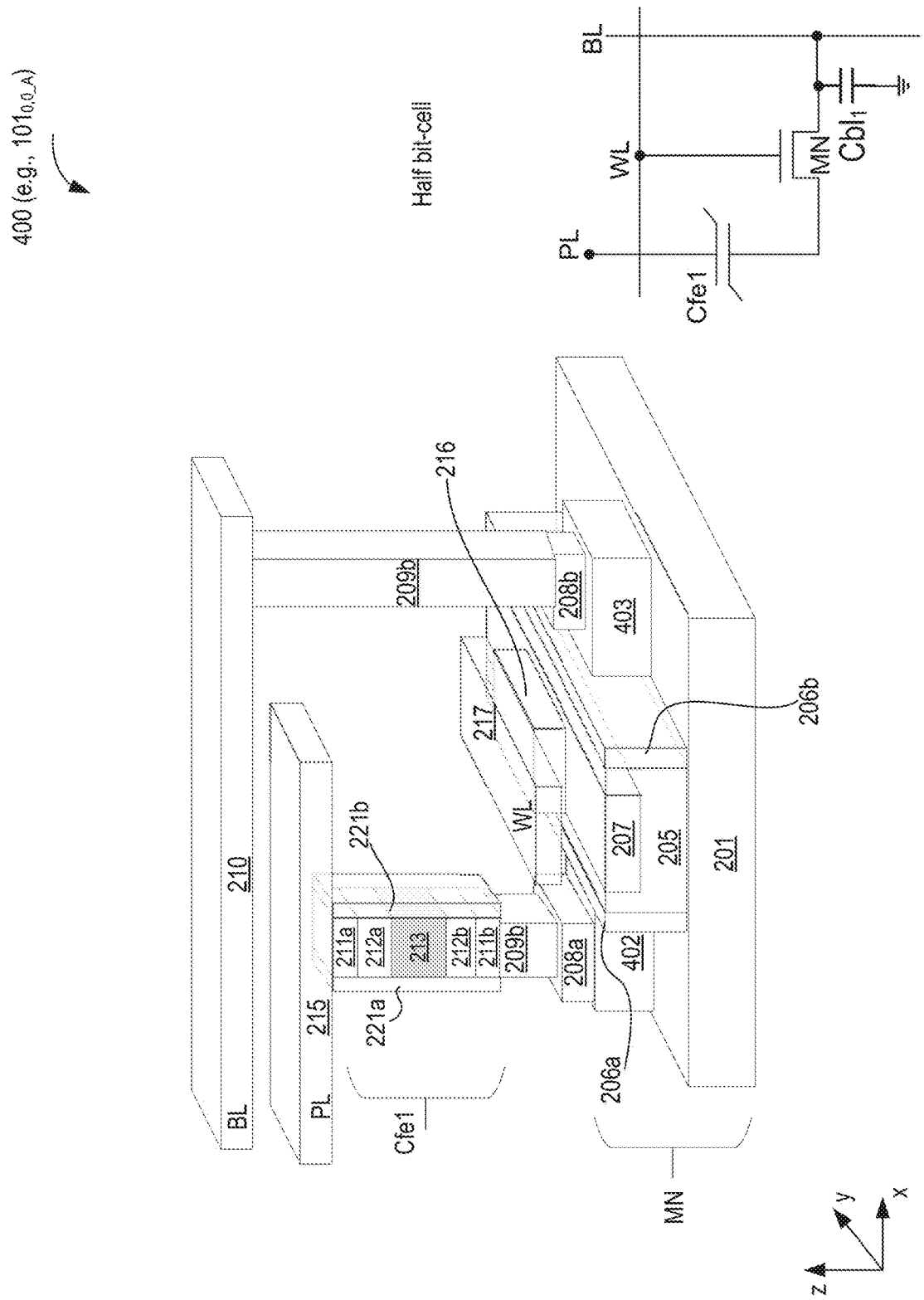
FIG. 4A illustrates a 3D view of a half bit-cell of the differential FE memory bit-cell comprising a non-planar transistor, in accordance with some embodiments.
Figure 4B:
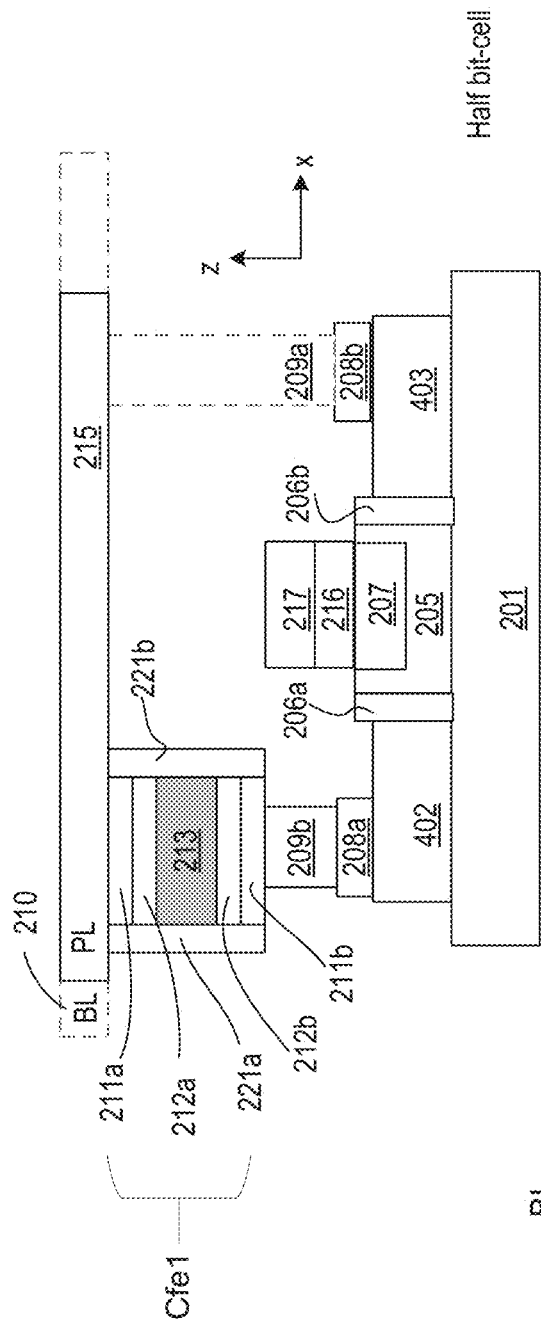
FIG. 4B illustrates a cross-sectional view of the half bit-cell of the differential FE memory bit-cell of FIG. 4A, in accordance with some embodiments.
Figure 4B:
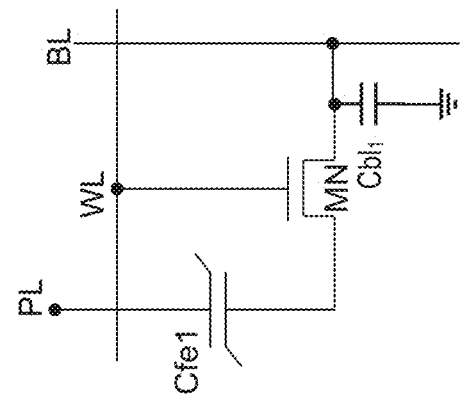
Figure 4C:
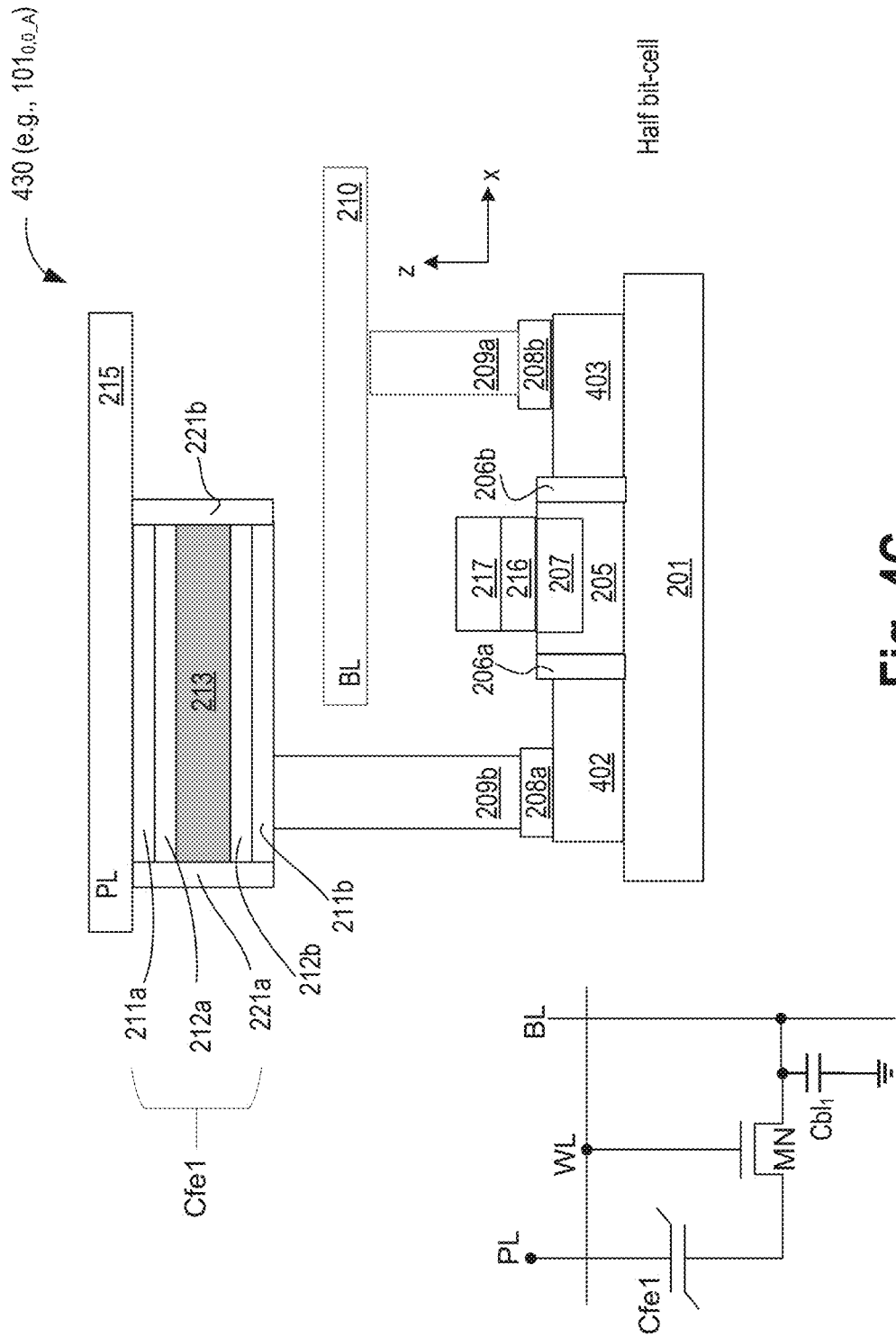
FIG. 4C illustrates a cross-sectional view of the half bit-cell of the differential FE memory bit-cell of FIG. 4A, wherein the FE capacitive structure is positioned above the bit-line, in accordance with some embodiments.

FIG. 4A illustrates 3D view 400 of a half bit-cell of the differential FE memory bit-cell comprising a non-planar transistor, in accordance with some embodiments. FIG. 4B illustrates a cross-section of the half bit-cell of the differential FE memory bit-cell of FIG. 4A, in accordance with some embodiments. The memory bit-cell of FIGS. 4A-B is similar to the memory bit-cell FIGS. 2A-B but for a non-planar transistor. FinFET is an example of a non-planar transistor. FinFET comprises a fin that includes source 402 and drain 403 regions. A channel resides between the source and regions 402 and 403. The transistor MN can have multiple fins parallel to one another that are coupled to the same gate stack. The fins pass through the gate stack forming source and drain regions 402 and 403. FIG. 4C illustrates cross-section 430 of the half bit-cell of the differential FE memory bit-cell of FIG. 4A, wherein the FE capacitive structure is positioned above the bit-line, in accordance with some embodiments. This embodiment allows for using the area above BL 210 to form the FE capacitive structure Cfe1.

Figure 5:
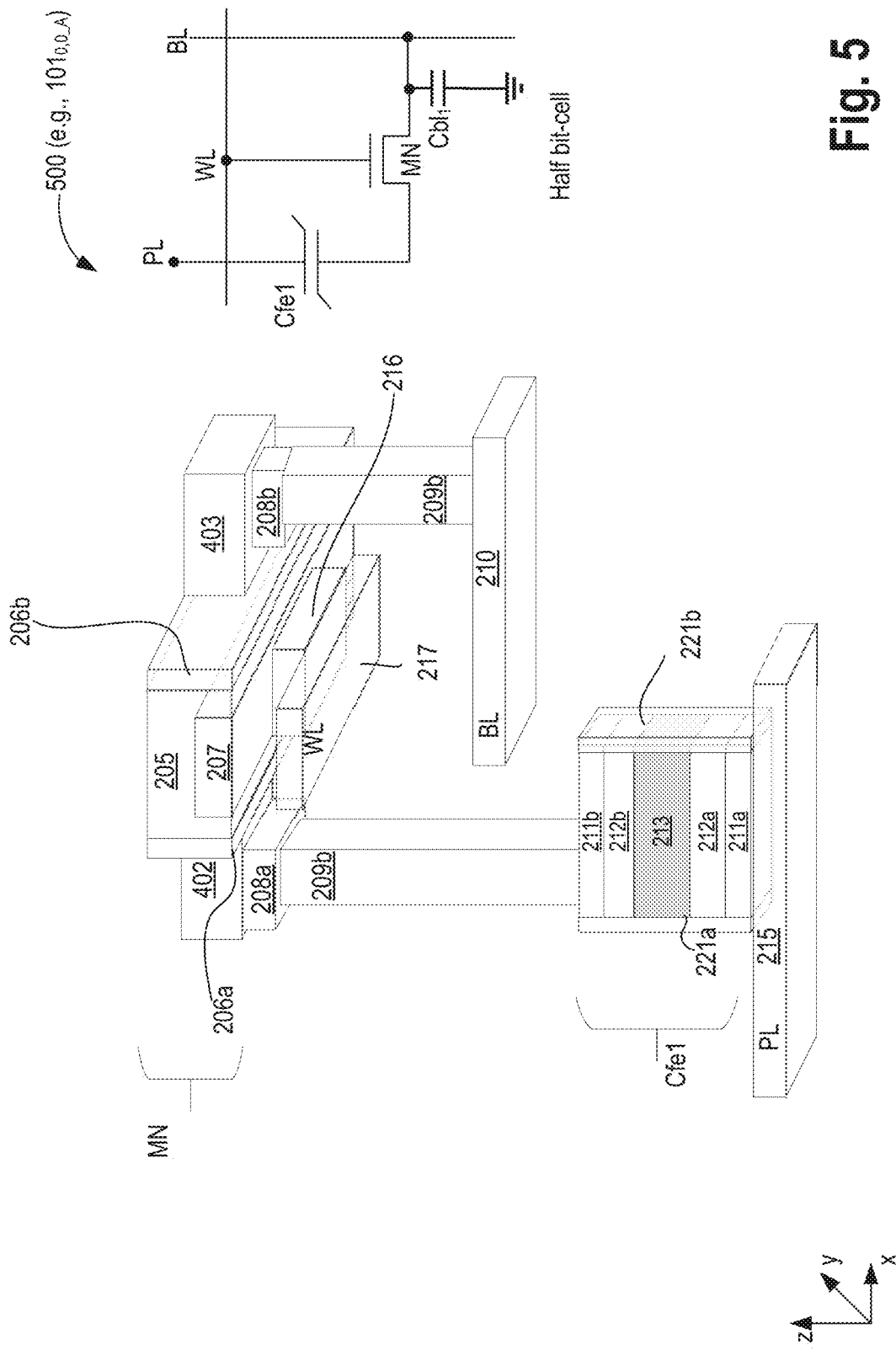
FIG. 5 illustrates a 3D view of a half bit-cell of the differential FE memory bit-cell comprising a non-planar transistor in a backend of a die, in accordance with some embodiments.

FIG. 5 illustrates 3D view 500 of a half bit-cell of the differential FE memory bit-cell comprising a non-planar transistor in a backend of a die, in accordance with some embodiments. While a FinFet is shown, any backend transistor that can couple to the FE capacitor structure can be used.

Figure 6:
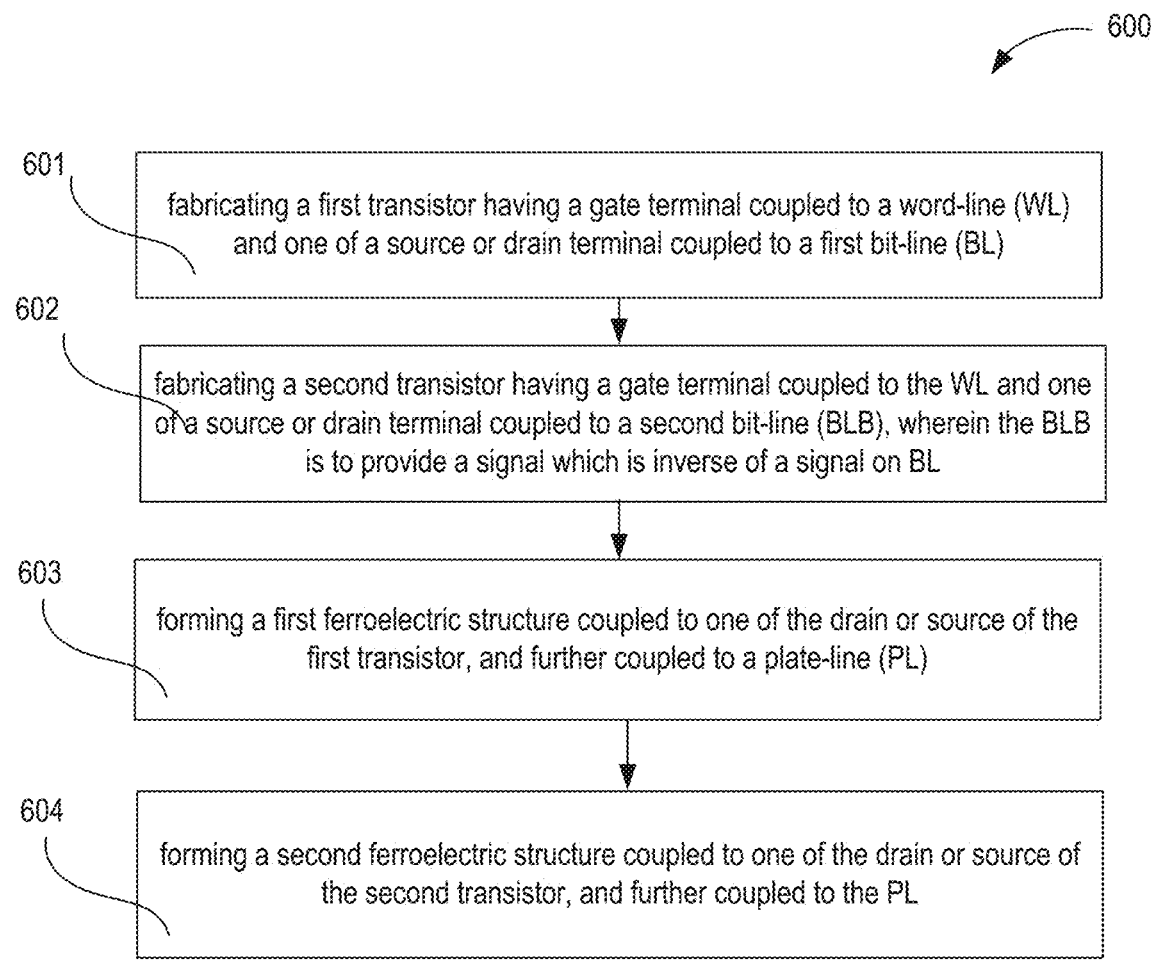
FIG. 6 illustrates a flowchart of a method of forming a differential FE memory bit-cell, in accordance with some embodiments.

FIG. 6 illustrates flowchart 600 for forming a differential non-volatile memory bit-cell, in accordance with some embodiments. While the blocks in flowchart 600 are illustrated in a particular order, the order is not determinative. For example, some blocks or processes can be performed before others, and some can be performed in parallel or simultaneously.

At block 601, the method comprises fabricating a first transistor $MN_1$ having a gate terminal coupled to a word-line (WL) and one of a source or drain terminal coupled to a first bit-line (BL). The transistor $MN_1$ can be planar or non-planar.

At block 602 the method comprises fabricating a second transistor $MN_2$ having a gate terminal coupled to the WL and one of a source or drain terminal coupled to a second bit-line (BLB), wherein the BLB is to provide a signal which is inverse of a signal on BL. At block 603, the method comprises forming a first ferroelectric structure Cfe1 coupled to one of the drain or source of the first transistor, and further coupled to a plate-line (PL) 215. At block 604, the method comprises forming a second ferroelectric structure Cfe2 coupled to one of the drain or source of the second transistor, and further coupled to the PL. The various materials for the FE capacitive structure, BL capacitors, and other layers is described with reference to FIGS. 2A-B.

Figure 7:
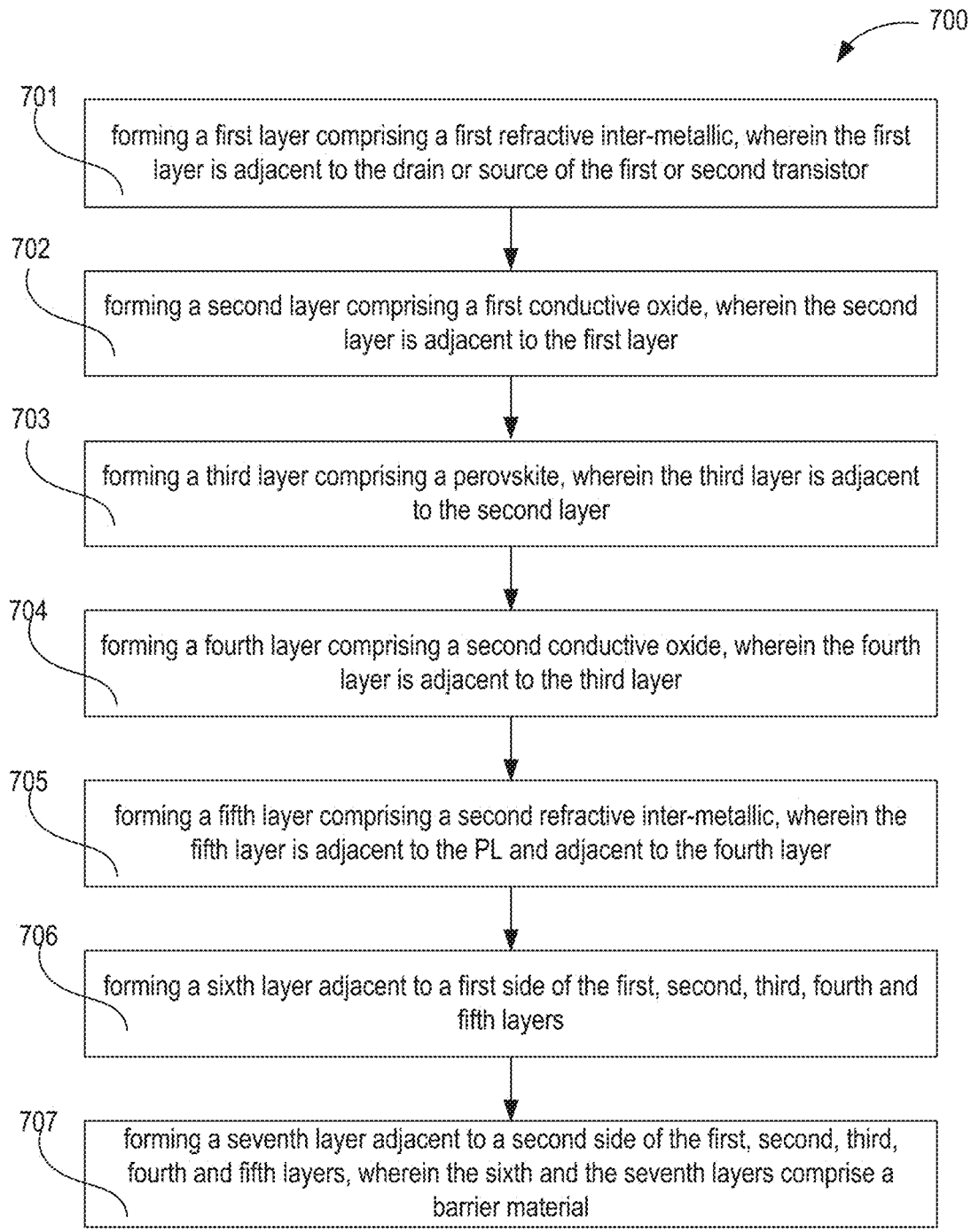
FIG. 7 illustrates a flowchart of a method of forming the FE capacitive structure for the differential FE memory bit-cell, in accordance with some embodiments

FIG. 7 illustrates flowchart 700 for a method of forming the first or second ferroelectric structure for the differential bit-cell, in accordance with some embodiments. While the blocks in flowchart 900 are illustrated in a particular order, the order is not determinative. For example, some blocks or processes can be performed before others, and some can be performed in parallel or simultaneously.

At block 701, the method comprises forming first layer 211b comprising a first refractive inter-metallic material, wherein the first layer is adjacent to the drain or source of the first or second transistor. At block 702, the method comprises forming second layer 212b comprising a first conductive oxide, wherein the second layer is adjacent to first layer 211b. At block 703, the method comprises forming third layer 213 comprising a perovskite material, wherein third layer 213 is adjacent to the second layer. In some embodiments, the perovskite material is doped with La or Lanthanides.

At block 704, the method comprises forming fourth layer 212a comprising a second conductive oxide, wherein the fourth layer is adjacent to the third layer. The first or second conductive oxides include oxides of one or more of: Ir, Ru, Pd, Ps, or Re. At block 705, the method comprises forming fifth layer 211a comprising a second refractive inter-metallic material, wherein the fifth layer is adjacent to PL 215 and adjacent to the fourth layer. The first and second refractive inter-metallic material includes one or more of: Ti, Al, Ta, W, or Co.

At block 706, the method comprises forming sixth layer 221a adjacent to a first side of the first, second, third, fourth and fifth layers. At block 707, the method comprises: forming seventh layer 221b adjacent to a second side of the first, second, third, fourth and fifth layers, wherein the sixth and the seventh layers comprise a barrier material. The barrier material includes one or more of an oxide of: Ti, Al, or Mg. The various materials for the FE capacitive structure are described with reference to FIGS. 2A-B.

Figure 8:
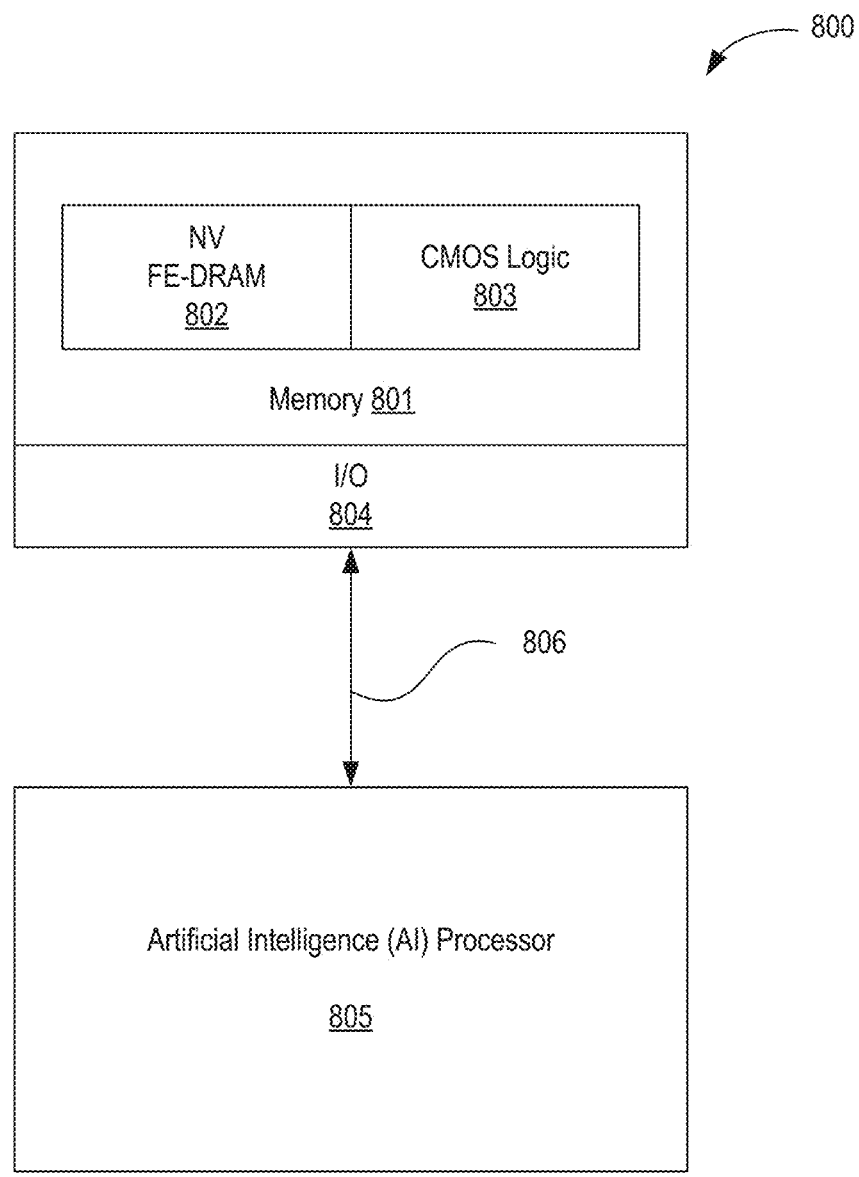
FIG. 8 illustrates a smart memory chip having an array of differential FE memory bit-cells and artificial intelligence (AI) processor, in accordance with some embodiments.

FIG. 8 illustrates smart memory chip 800 having an array of differential non-volatile ferroelectric bit-cells and logic, in accordance with some embodiments. Chip 800 comprises memory module 801 having non-volatile differential ferroelectric DRAM (FE-DRAM) array 802, where the array comprises differential bit-cells as those described with reference to various embodiments here. Memory module 801 further comprises CMOS logic 803 such as decoders, multiplexers, and drivers to drive BL, WL, PL. Memory module 801 further includes an input-output (IO) interface 804 which is used to communicate via link 805 with another device such as an artificial intelligence (AI) processor 805 (e.g., a dedicated AI processor, a graphics processor configured as an AI processor).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples illustrates the various embodiments. Any one example can be combined with other examples described herein.

Example 1: A differential bit-cell comprising: a first transistor having a gate terminal coupled to a word-line (WL) and one of a source or drain terminal coupled to a first bit-line (BL); a second transistor having a gate terminal coupled to the WL and one of a source or drain terminal coupled to a second bit-line (BLB), wherein the BLB is to provide a signal which is inverse of a signal on BL; a first non-volatile structure coupled to one of the drain or source of the first transistor, and further coupled to a plate-line (PL); and a second non-volatile structure coupled to one of the drain or source of the second transistor, and further coupled to the PL; wherein the each of the first and second non-volatile structures comprises: a first layer comprising a first refractive inter-metallic material, wherein the first layer is adjacent to the drain or source of the first or second transistor; a second layer comprising a first conductive oxide, wherein the second layer is adjacent to the first layer; a third layer comprising a perovskite material, wherein the third layer is adjacent to the second layer; a fourth layer comprising a second conductive oxide, wherein the fourth layer is adjacent to the third layer; and a fifth layer comprising a second refractive inter-metallic material, wherein the fifth layer is adjacent to the PL and adjacent to the fourth layer.

Example 2: The differential bit-cell of example 1, wherein the each of the first and second non-volatile structures comprises: a sixth layer adjacent to a first side of the first, second, third, fourth and fifth layers; and a seventh layer adjacent to a second side of the first, second, third, fourth and fifth layers, wherein the sixth and the seventh layers comprise a barrier material.

Example 3: The differential bit-cell of example 1, wherein the first and second transistors are of a same conductivity type.

Example 4: The differential bit-cell of example 1, wherein the first and second transistors are one of planar transistors or non-planar transistors.

Example 5: The differential bit-cell of example 2, wherein: the barrier material includes one or more of an oxide of: Ti, Al, or Mg; the perovskite material is doped with La or Lanthanides; or the refractive inter-metallic material includes one or more of: Ti, Al, Ta, W, or Co.

Example 6: The differential bit-cell of example 1, wherein the first and second transistors are positioned in a backend of a die, or wherein the transistor is positioned in a frontend of the die.

Example 7: The differential bit-cell of example 1, wherein the first or second conductive oxides include oxides of one or more of: Ir, Ru, Pd, Ps, or Re.

Example 8: The differential bit-cell of example 1, wherein the perovskite material includes one of: LaCoO3, SrCoO3, SrRuO3, LaMnO3, SrMnO3, YBa2Cu3O7, Bi2Sr2CaCu2O8, or LaNiO3.

Example 9: The differential bit-cell of example 1, wherein the perovskite material includes one of: La, Sr, Co, Ru, Mn, Y, Na, Cu, or Ni.

Example 10: The differential bit-cell of example 1, wherein the capacitive structure is cylindrical in shape.

Example 11: The differential bit-cell of example 1, wherein the perovskite material is doped with Sc or Mn to control leakage through the third layer.

Example 12: The differential bit-cell of example 1, wherein the reference supply line is ground.

Example 13: The differential bit-cell of example 1, wherein the first transistor and first non-volatile structure are controlled to store data of a first value, and wherein the second transistor and second non-volatile structure are controlled to store data of a second value, wherein the first value is an inverse of the second value.

Example 14: A system comprising: an artificial intelligence processor; and a non-volatile memory coupled to the AI processor, wherein the non-volatile memory includes differential bit-cells, wherein one of the differential bit-cell includes: a first transistor having a gate terminal coupled to a word-line (WL) and one of a source or drain terminal coupled to a first bit-line (BL); a second transistor having a gate terminal coupled to the WL and one of a source or drain terminal coupled to a second bit-line (BLB), wherein the BLB is to provide a signal which is inverse of a signal on BL; a first non-volatile structure coupled to one of the drain or source of the first transistor, and further coupled to a plate-line (PL); and a second non-volatile structure coupled to one of the drain or source of the second transistor, and further coupled to the PL; wherein the each of the first and second non-volatile structures comprises: a first layer comprising a first refractive inter-metallic material, wherein the first layer is adjacent to the drain or source of the first or second transistor; a second layer comprising a first conductive oxide, wherein the second layer is adjacent to the first layer; a third layer comprising a perovskite material, wherein the third layer is adjacent to the second layer; a fourth layer comprising a second conductive oxide, wherein the fourth layer is adjacent to the third layer; and a fifth layer comprising a second refractive inter-metallic material, wherein the fifth layer is adjacent to the PL and adjacent to the fourth layer.

Example 15: The system of example 14, wherein the each of the first and second non-volatile structures comprises: a sixth layer adjacent to a first side of the first, second, third, fourth and fifth layers; and a seventh layer adjacent to a second side of the first, second, third, fourth and fifth layers, wherein the sixth and the seventh layers comprise a barrier material.

Example 16: The system of example 14, wherein the first and second transistors are of a same conductivity type, and wherein the first and second transistors are one of planar transistors or non-planar transistors.

Example 17: The system of example 14, wherein: the barrier material includes one or more of an oxide of: Ti, Al, or Mg; the perovskite material is doped with La or Lanthanides; the refractive inter-metallic material includes one or more of: Ti, Al, Ta, W, or Co; and the first or second conductive oxides include oxides of one or more of: Ir, Ru, Pd, Ps, or Re.

Example 18: The system of example 14, wherein the first and second transistors are positioned in a backend of a die, or wherein the transistor is positioned in a frontend of the die.

Example 19: The system of example 14, wherein the perovskite material includes one of: LaCoO3, SrCoO3, SrRuO3, LaMnO3, SrMnO3, YBa2Cu3O7, Bi2Sr2CaCu2O8, or LaNiO3.

Example 20: The system of example 14, wherein the perovskite material includes one of: La, Sr, Co, Ru, Mn, Y, Na, Cu, or Ni.

Example 21: A method for forming a differential bit-cell, the method comprising: fabricating a first transistor having a gate terminal coupled to a word-line (WL) and one of a source or drain terminal coupled to a first bit-line (BL); fabricating a second transistor having a gate terminal coupled to the WL and one of a source or drain terminal coupled to a second bit-line (BLB), wherein the BLB is to provide a signal which is inverse of a signal on BL; forming a first ferroelectric structure coupled to one of the drain or source of the first transistor, and further coupled to a plate-line (PL); and forming a second ferroelectric structure coupled to one of the drain or source of the second transistor, and further coupled to the PL, wherein the first and second ferroelectric structures comprise perovskite material.

Example 22: The method of example 21, wherein forming the first or second ferroelectric structures comprises: forming a first layer comprising a first refractive inter-metallic material, wherein the first layer is adjacent to the drain or source of the first or second transistor; forming a second layer comprising a first conductive oxide, wherein the second layer is adjacent to the first layer; forming a third layer comprising a perovskite material, wherein the third layer is adjacent to the second layer; forming a fourth layer comprising a second conductive oxide, wherein the fourth layer is adjacent to the third layer; and forming a fifth layer comprising a second refractive inter-metallic material, wherein the fifth layer is adjacent to the PL and adjacent to the fourth layer.

Example 23: The method of example 22, wherein forming the first or second ferroelectric structures comprises: forming a sixth layer adjacent to a first side of the first, second, third, fourth and fifth layers; and forming a seventh layer adjacent to a second side of the first, second, third, fourth and fifth layers, wherein the sixth and the seventh layers comprise a barrier material.

Example 24: The method of example 23, wherein: the barrier material includes one or more of an oxide of: Ti, Al, or Mg; the transistor is one of a planar or non-planar transistor; the perovskite material is doped with La or Lanthanides; the refractive inter-metallic material includes one or more of: Ti, Al, Ta, W, or Co; and the first or second conductive oxides include oxides of one or more of: Ir, Ru, Pd, Ps, or Re.

Example 25: A differential bit-cell comprising: a first transistor having a gate terminal coupled to a word-line (WL) and one of a source or drain terminal coupled to a first bit-line (BL); a second transistor having a gate terminal coupled to the WL and one of a source or drain terminal coupled to a second bit-line (BLB), wherein the BLB is to provide a signal which is inverse of a signal on BL; a first non-volatile structure coupled to one of the drain or source of the first transistor, and further coupled to a plate-line (PL); and a second non-volatile structure coupled to one of the drain or source of the second transistor, and further coupled to the PL; wherein the each of the first and second non-volatile structures comprises: a first layer comprising a first refractive inter-metallic material, wherein the first layer is adjacent to the drain or source of the first or second transistor; a second layer comprising a first conductive oxide, wherein the second layer is adjacent to the first layer; a third layer comprising a hexagonal ferroelectric, wherein the third layer is adjacent to the second layer; a fourth layer comprising a second conductive oxide, wherein the fourth layer is adjacent to the third layer; and a fifth layer comprising a second refractive inter-metallic material, wherein the fifth layer is adjacent to the PL and adjacent to the fourth layer.

Example 26: The differential bit-cell of example 25, wherein the each of the first and second non-volatile structures comprises: a sixth layer adjacent to a first side of the first, second, third, fourth and fifth layers; and a seventh layer adjacent to a second side of the first, second, third, fourth and fifth layers, wherein the sixth and the seventh layers comprise a barrier material.

Example 27: The differential bit-cell of example 26, wherein the first and second transistors are of a same conductivity type.

Example 28: The differential bit-cell of example 25, wherein the first and second transistors are one of planar transistors or non-planar transistors.

Example 29: The differential bit-cell of example 26, wherein the barrier material includes one or more of an oxide of: Ti, Al, or Mg.

Example 30: The differential bit-cell of example 26, wherein the refractive inter-metallic material includes one or more of: Ti, Al, Ta, W, or Co.

Example 31: The differential bit-cell of example 26, wherein the first and second transistors are positioned in a backend of a die, or wherein the transistor is positioned in a frontend of the die.

Example 32: The differential bit-cell of example 26, wherein the first or second conductive oxides includes: In2O3, Fe2O3, Fe3O4; PtCoO3, PdCoO2, Al doped ZnO, or Sn doped In2O3.

Example 33: The differential bit-cell of example 26, wherein the hexagonal ferroelectric includes one of: YMNO3 or LuFeO3.

Example 34: The differential bit-cell of example 26, wherein hexagonal ferroelectric is of a type h-RMnO3, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y).

Example 35: The differential bit-cell of example 26, wherein the capacitive structure is cylindrical in shape.

Example 36: The differential bit-cell of example 26, wherein the reference supply line is ground.

Example 37: The differential bit-cell of example 26, wherein the first transistor, first capacitor, and first non-volatile structure are controlled to store data of a first value, and wherein the second transistor, second capacitor, and second non-volatile structure are controlled to store data of a second value, wherein the first value is an inverse of the second value.

Example 38: A system comprising: an artificial intelligence processor; and a non-volatile memory coupled to the AI processor, wherein the non-volatile memory includes differential bit-cells, wherein one of the differential bit-cell includes: a first transistor having a gate terminal coupled to a word-line (WL) and one of a source or drain terminal coupled to a first bit-line (BL); a second transistor having a gate terminal coupled to the WL and one of a source or drain terminal coupled to a second bit-line (BLB), wherein the BLB is to provide a signal which is inverse of a signal on BL; a first non-volatile structure coupled to one of the drain or source of the first transistor, and further coupled to a plate-line (PL); and a second non-volatile structure coupled to one of the drain or source of the second transistor, and further coupled to the PL; wherein the each of the first and second non-volatile structures comprises: a first layer comprising a first refractive inter-metallic material, wherein the first layer is adjacent to the drain or source of the first or second transistor; a second layer comprising a first conductive oxide, wherein the second layer is adjacent to the first layer; a third layer comprising a hexagonal ferroelectric, wherein the third layer is adjacent to the second layer; a fourth layer comprising a second conductive oxide, wherein the fourth layer is adjacent to the third layer; and a fifth layer comprising a second refractive inter-metallic material, wherein the fifth layer is adjacent to the PL and adjacent to the fourth layer.

Example 39: The system of example 38, wherein the each of the first and second non-volatile structures comprises: a sixth layer adjacent to a first side of the first, second, third, fourth and fifth layers; and a seventh layer adjacent to a second side of the first, second, third, fourth and fifth layers, wherein the sixth and the seventh layers comprise a barrier material.

Example 40: The system of example 38, wherein the first and second transistors are of a same conductivity type, and wherein the first and second transistors are one of planar transistors or non-planar transistors.

Example 41: The system of example 39, wherein the barrier material includes one or more of an oxide of: Ti, Al, or Mg.

Example 42: The system of example 38, wherein the refractive inter-metallic material includes one or more of: Ti, Al, Ta, W, or Co.

Example 43: The system of example 38, wherein the first or second conductive oxides include oxides of one or more of: In2O3, Fe2O3, Fe3O4; PtCoO3, PdCoO2, Al doped ZnO, or Sn doped In2O3.

Example 44: The system of example 38, wherein the first and second transistors are positioned in a backend of a die, or wherein the transistor is positioned in a frontend of the die.

Example 45: The system of example 38, wherein the hexagonal ferroelectric includes one of: YMNO3 or LuFeO3.

Example 46: The system of example 38, wherein hexagonal ferroelectric is of a type h-RMnO3, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y).

Example 47: a method for forming a differential bit-cell, the method comprising: fabricating a first transistor having a gate terminal coupled to a word-line (WL) and one of a source or drain terminal coupled to a first bit-line (BL); fabricating a second transistor having a gate terminal coupled to the WL and one of a source or drain terminal coupled to a second bit-line (BLB), wherein the BLB is to provide a signal which is inverse of a signal on BL; forming a first ferroelectric structure coupled to one of the drain or source of the first transistor, and further coupled to a plate-line (PL); and forming a second ferroelectric structure coupled to one of the drain or source of the second transistor, and further coupled to the PL, wherein the first and second ferroelectric structures comprises hexagonal ferroelectric.

Example 48: The method of example 47, wherein forming the first or second ferroelectric structures comprises: forming a first layer comprising a first refractive inter-metallic material, wherein the first layer is adjacent to the drain or source of the first or second transistor; forming a second layer comprising a first conductive oxide, wherein the second layer is adjacent to the first layer; forming a third layer comprising a hexagonal ferroelectric, wherein the third layer is adjacent to the second layer; forming a fourth layer comprising a second conductive oxide, wherein the fourth layer is adjacent to the third layer; and forming a fifth layer comprising a second refractive inter-metallic material, wherein the fifth layer is adjacent to the PL and adjacent to the fourth layer.

Example 49: The method of example 48, wherein forming the first or second ferroelectric structures comprises: forming a sixth layer adjacent to a first side of the first, second, third, fourth and fifth layers; and forming a seventh layer adjacent to a second side of the first, second, third, fourth and fifth layers, wherein the sixth and the seventh layers comprise a barrier material.

Example 50: A differential bit-cell comprising: a first transistor having a gate terminal coupled to a word-line (WL) and one of a source or drain terminal coupled to a first bit-line (BL); a second transistor having a gate terminal coupled to the WL and one of a source or drain terminal coupled to a second bit-line (BLB), wherein the BLB is to provide a signal which is inverse of a signal on BL; a first non-volatile structure coupled to one of the drain or source of the first transistor, and further coupled to a plate-line (PL); and a second non-volatile structure coupled to one of the drain or source of the second transistor, and further coupled to the PL; wherein the each of the first and second non-volatile structures comprises: a first layer comprising a first refractive inter-metallic material, wherein the first layer is adjacent to the drain or source of the first or second transistor; a second layer comprising a first conductive oxide, wherein the second layer is adjacent to the first layer; a third layer comprising an improper ferroelectric, wherein the third layer is adjacent to the second layer; a fourth layer comprising a second conductive oxide, wherein the fourth layer is adjacent to the third layer; and a fifth layer comprising a second refractive inter-metallic material, wherein the fifth layer is adjacent to the PL and adjacent to the fourth layer.

Example 51: The differential bit-cell of example 50, wherein the each of the first and second non-volatile structures comprises: a sixth layer adjacent to a first side of the first, second, third, fourth and fifth layers; and a seventh layer adjacent to a second side of the first, second, third, fourth and fifth layers, wherein the sixth and the seventh layers comprise a barrier material.

Example 52: The differential bit-cell of example 51, wherein the first and second transistors are of a same conductivity type.

Example 53: The differential bit-cell of example 51, wherein the first and second transistors are one of planar transistors or non-planar transistors.

Example 54: The differential bit-cell of example 53, wherein the barrier material includes one or more of an oxide of: Ti, Al, or Mg.

Example 55: The differential bit-cell of example 51, wherein the refractive inter-metallic material includes one or more of: Ti, Al, Ta, W, or Co.

Example 56: The differential bit-cell of example 51, wherein the first and second transistors are positioned in a backend of a die, or wherein the transistor is positioned in a frontend of the die.

Example 57: The differential bit-cell of example 51, wherein the first or second conductive oxides includes: $In_2O_3$, $Fe_2O_3$, $Fe_3O_4$; $PtCoO_3$, $PdCoO_2$, Al doped ZnO, or Sn doped $In_2O_3$.

Example 58: The differential bit-cell of example 51, wherein improper ferroelectric includes one of: [PTO/STO]n or [LAO/STO]n, where 'n' is between 1 to 100.

Example 59: The differential bit-cell of example 51, wherein the capacitive structure is cylindrical in shape.

Example 60: The differential bit-cell of example 51, wherein the reference supply line is ground.

Example 61: The differential bit-cell of example 51, wherein the first transistor, first capacitor, and first non-volatile structure are controlled to store data of a first value, and wherein the second transistor, second capacitor, and second non-volatile structure are controlled to store data of a second value, wherein the first value is an inverse of the second value.

Example 62: A system comprising: an artificial intelligence processor; and a non-volatile memory coupled to the AI processor, wherein the non-volatile memory includes differential bit-cells, wherein one of the differential bit-cell includes: a first transistor having a gate terminal coupled to a word-line (WL) and one of a source or drain terminal coupled to a first bit-line (BL); a second transistor having a gate terminal coupled to the WL and one of a source or drain terminal coupled to a second bit-line (BLB), wherein the BLB is to provide a signal which is inverse of a signal on BL; a first non-volatile structure coupled to one of the drain or source of the first transistor, and further coupled to a plate-line (PL); and a second non-volatile structure coupled to one of the drain or source of the second transistor, and further coupled to the PL; wherein the each of the first and second non-volatile structures comprises: a first layer comprising a first refractive inter-metallic material, wherein the first layer is adjacent to the drain or source of the first or second transistor; a second layer comprising a first conductive oxide, wherein the second layer is adjacent to the first layer; a third layer comprising an improper ferroelectric, wherein the third layer is adjacent to the second layer; a fourth layer comprising a second conductive oxide, wherein the fourth layer is adjacent to the third layer; and a fifth layer comprising a second refractive inter-metallic material, wherein the fifth layer is adjacent to the PL and adjacent to the fourth layer.

Example 63: The system of example 62, wherein the each of the first and second non-volatile structures comprises: a sixth layer adjacent to a first side of the first, second, third, fourth and fifth layers; and a seventh layer adjacent to a second side of the first, second, third, fourth and fifth layers, wherein the sixth and the seventh layers comprise a barrier material.

Example 64: The system of example 63, wherein the first and second transistors are of a same conductivity type, and wherein the first and second transistors are one of planar transistors or non-planar transistors.

Example 65: The system of example 63, wherein the barrier material includes one or more of an oxide of: Ti, Al, or Mg.

Example 66: The system of example 63, wherein the refractive inter-metallic material includes one or more of: Ti, Al, Ta, W, or Co.

Example 67: The system of example 63, wherein the first or second conductive oxides include oxides of one or more of: $In_2O_3$, $Fe_2O_3$, $Fe_3O_4$; $PtCoO_3$, $PdCoO_2$, Al doped ZnO, or Sn doped $In_2O_3$.

Example 68: The system of example 63, wherein the first and second transistors are positioned in a backend of a die, or wherein the transistor is positioned in a frontend of the die.

Example 69: The system of example 63, wherein improper ferroelectric includes one of: [PTO/STO]n or [LAO/STO]n, where 'n' is between 1 to 100.

Example 70: A method for forming a differential bit-cell, the method comprising: fabricating a first transistor having a gate terminal coupled to a word-line (WL) and one of a source or drain terminal coupled to a first bit-line (BL); fabricating a second transistor having a gate terminal coupled to the WL and one of a source or drain terminal coupled to a second bit-line (BLB), wherein the BLB is to provide a signal which is inverse of a signal on BL; forming a first ferroelectric structure coupled to one of the drain or source of the first transistor, and further coupled to a plate-line (PL); and forming a second ferroelectric structure coupled to one of the drain or source of the second transistor, and further coupled to the PL, wherein the first and second ferroelectric structures comprises improper ferroelectric.

Example 71: The method of example 70, wherein forming the first or second ferroelectric structures comprises: forming a first layer comprising a first refractive inter-metallic material, wherein the first layer is adjacent to the drain or source of the first or second transistor; forming a second layer comprising a first conductive oxide, wherein the second layer is adjacent to the first layer; forming a third layer comprising a hexagonal ferroelectric, wherein the third layer is adjacent to the second layer; forming a fourth layer comprising a second conductive oxide, wherein the fourth layer is adjacent to the third layer; and forming a fifth layer comprising a second refractive inter-metallic material, wherein the fifth layer is adjacent to the PL and adjacent to the fourth layer.

Example 72: The method of example 71, wherein forming the first or second ferroelectric structures comprises: forming a sixth layer adjacent to a first side of the first, second, third, fourth and fifth layers; and forming a seventh layer adjacent to a second side of the first, second, third, fourth and fifth layers, wherein the sixth and the seventh layers comprise a barrier material.

Example 73: A capacitive structure comprising: a first structure comprising refractive inter-metallic material, wherein the first structure is adjacent to the source or drain of the transistor; a second structure comprising a first conductive oxide; a third structure comprising a ferroelectric material, wherein the third structure is adjacent to the second structure; a fourth structure comprising a second conductive oxide, wherein the fourth structure is adjacent to the third structure, and wherein the third structures is between the second and fourth structures; a fifth structure comprising refractive inter-metallic material, wherein the fifth structure is adjacent the fourth structure; a sixth structure adjacent to first sides of the first, second, third, fourth, and fifth structures; and a seventh structure adjacent to second sides of the first, second, third, fourth, and fifth structures, wherein the sixth and the seventh structures comprise a barrier material.

Example 74: The capacitive structure of example 73, wherein the ferroelectric material is one of: perovskite material, hexagonal ferroelectric, or improper ferroelectric.

Example 75: The capacitive structure of example 74, wherein: the ferroelectric material includes one of: perovskite material which includes one of: LaCoO3, SrCoO3, SrRuO3, LaMnO3, SrMnO3, YBa2Cu3O7, Bi2Sr2CaCu2O8, or LaNiO3; hexagonal ferroelectric includes one of: YMnO3, or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); or improper ferroelectric includes one of: [PTO/STO]n or [LAO/STO]n, where 'n' is between 1 to 100.

Example 76: The capacitive structure of example 73, wherein the barrier material includes one or more of an oxide of: Ti, Al, or Mg.

Example 77: The capacitive structure of example 73, wherein the first or second refractive inter-metallic material include one or more of: Ti, Al, Ta, W, or Co.

Example 78: The capacitive structure of example 73, wherein the first and second conductive oxides include oxides of one of: Ir, Ru, Pd, Ps, or Re when the ferroelectric material is a perovskite material; PtCo, PdCo, delafossite structured hexagonal metallic when the ferroelectric material is hexagonal ferroelectrics; Fe, LiV; or InTi.

Example 79: The capacitive structure of example 73, wherein the ferroelectric material is doped with Sc or Mn to control leakage through the ferroelectric material.

Example 80: A method for forming a capacitive structure, the method comprising: forming a first structure comprising refractive inter-metallic material, wherein the first structure is adjacent to the source or drain of the transistor; forming a second structure comprising a first conductive oxide; forming a third structure comprising a ferroelectric material, wherein the third structure is adjacent to the second structure; forming a fourth structure comprising a second conductive oxide, wherein the fourth structure is adjacent to the third structure, and wherein the third structures is between the second and fourth structures; forming a fifth structure comprising refractive inter-metallic material, wherein the fifth structure is adjacent the fourth structure; forming a sixth structure adjacent to first sides of the first, second, third, fourth, and fifth structures; and forming a seventh structure adjacent to second sides of the first, second, third, fourth, and fifth structures, wherein the sixth and the seventh structures comprise a barrier material.

Example 81: The method of example 80, wherein the ferroelectric material is one of: perovskite material, hexagonal ferroelectric, or improper ferroelectric.

Example 82: The method of example 81, wherein: the ferroelectric material includes one of: perovskite material which includes one of: LaCoO3, SrCoO3, SrRuO3, LaMnO3, SrMnO3, YBa2Cu3O7, Bi2Sr2CaCu2O8, or LaNiO3; hexagonal ferroelectric includes one of: YMnO3, or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); or improper ferroelectric includes one of: [PTO/STO]n or [LAO/STO]n, where 'n' is between 1 to 100.

Example 83: The method of example 81, wherein the barrier material includes one or more of an oxide of: Ti, Al, or Mg.

Example 84: The method of example 80, wherein the first or second refractive inter-metallic material include one or more of: Ti, Al, Ta, W, or Co.

Example 85: The method of example 80, wherein the first and second conductive oxides include oxides of one of: Ir, Ru, Pd, Ps, or Re when the ferroelectric material is a perovskite material; PtCo, PdCo, delafossite structured hexagonal metallic when the ferroelectric material is hexagonal ferroelectrics; Fe, LiV; or InTi.

Example 86: The method of example 80, wherein the ferroelectric material is doped with Sc or Mn to control leakage through the ferroelectric material.

Example 87: A system comprising: a memory comprising a capacitive structure; and an artificial intelligence (AI) processor coupled to the memory, wherein the capacitive structure comprises: a first structure comprising refractive inter-metallic material, wherein the first structure is adjacent to the source or drain of the transistor; a second structure comprising a first conductive oxide; a third structure comprising a ferroelectric material, wherein the third structure is adjacent to the second structure; a fourth structure comprising a second conductive oxide, wherein the fourth structure is adjacent to the third structure, and wherein the third structures is between the second and fourth structures; a fifth structure comprising refractive inter-metallic material, wherein the fifth structure is adjacent the fourth structure; a sixth structure adjacent to first sides of the first, second, third, fourth, and fifth structures; and a seventh structure adjacent to second sides of the first, second, third, fourth, and fifth structures, wherein the sixth and the seventh structures comprise a barrier material.

Example 88: The system of example 87, wherein the ferroelectric material is one of: perovskite material, hexagonal ferroelectric, or improper ferroelectric.

Example 89: The system of example 88, wherein: the ferroelectric material includes one of: perovskite material which includes one of: LaCoO3, SrCoO3, SrRuO3, LaMnO3, SrMnO3, YBa2Cu3O7, Bi2Sr2CaCu2O8, or LaNiO3; hexagonal ferroelectric includes one of: YMnO3, or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); or improper ferroelectric includes one of: [PTO/STO]n or [LAO/STO]n, where 'n' is between 1 to 100.

Example 90: The system of example 88, wherein the barrier material includes one or more of an oxide of: Ti, Al, or Mg.

Example 91: The system of example 88, wherein the first or second refractive inter-metallic material include one or more of: Ti, Al, Ta, W, or Co.

Example 92: The system of example 88, wherein the first and second conductive oxides include oxides of one of: Ir, Ru, Pd, Ps, or Re when the ferroelectric material is a perovskite material; PtCo, PdCo, delafossite structured hexagonal metallic when the ferroelectric material is hexagonal ferroelectrics; Fe, LiV; or InTi.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A differential bit-cell comprising:
    a first transistor having a gate terminal coupled to a word-line (WL) and one of a source or drain terminal coupled to a first bit-line (BL);
    a second transistor having a gate terminal coupled to the WL and one of a source or drain terminal coupled to a second bit-line (BLB), wherein the BLB is to provide a signal which is inverse of a signal on BL;
    a first non-volatile structure coupled to one of the drain or source of the first transistor, and further coupled to a plate-line (PL); and
    a second non-volatile structure coupled to one of the drain or source of the second transistor, and further coupled to the PL;
    wherein each of the first and second non-volatile structures comprises:
        a first layer comprising a first refractive inter-metallic material, wherein the first layer is adjacent to the drain or source of the first or second transistor;
        a second layer comprising a first conductive oxide, wherein the second layer is adjacent to the first layer;
        a third layer comprising a perovskite material, wherein the third layer is adjacent to the second layer;
        a fourth layer comprising a second conductive oxide, wherein the fourth layer is adjacent to the third layer;
        a fifth layer comprising a second refractive inter-metallic material, wherein the fifth layer is adjacent to the PL and adjacent to the fourth layer;
        a sixth layer directly adjacent to first sides of the first, second, third, fourth and fifth layers; and
        a seventh layer directly adjacent to second sides of the first, second, third, fourth and fifth layers, wherein the sixth and the seventh layers comprise a barrier material.

2. The differential bit-cell of claim 1, wherein the first and second transistors are of a same conductivity type.

3. The differential bit-cell of claim 1, wherein the first and second transistors are one of planar transistors or non-planar transistors.

4. The differential bit-cell of claim 1, wherein:
    the barrier material includes one or more of an oxide of: Ti, Al, or Mg;
    the perovskite material is doped with La or Lanthanides; or
    the refractive inter-metallic material includes one or more of: Ti, Al, Ta, W, or Co.

5. The differential bit-cell of claim 1, wherein the first and second transistors are positioned in a backend of a die, or wherein the first and second transistors are positioned in a frontend of the die.

6. The differential bit-cell of claim 1, wherein the first or second conductive oxides include oxides of one or more of: Ir, Ru, Pd, Ps, or Re.

7. The differential bit-cell of claim 1, wherein the perovskite material includes one of: LaCoO3, SrCoO3, SrRuO3, LaMnO3, SrMnO3, YBa2Cu3O7, Bi2Sr2CaCu2O8, or LaNiO3.

8. The differential bit-cell of claim 1, wherein the perovskite material includes one of: La, Sr, Co, Ru, Mn, Y, Na, Cu, or Ni.

9. The differential bit-cell of claim 1, wherein the first non-volatile structure is cylindrical in shape.

10. The differential bit-cell of claim 1, wherein the perovskite material is doped with Sc or Mn to control leakage through the third layer.

11. The differential bit-cell of claim 1, wherein the first transistor and first non-volatile structure are controlled to store data of a first value, wherein the second transistor and second non-volatile structure are controlled to store data of a second value, and wherein the first value is an inverse of the second value.

12. A system comprising:
    an artificial intelligence processor; and
    a non-volatile memory coupled to the artificial intelligence processor, wherein the non-volatile memory includes differential bit-cells, wherein one of the differential bit-cell includes:
        a first transistor having a gate terminal coupled to a word-line (WL) and one of a source or drain terminal coupled to a first bit-line (BL);
        a second transistor having a gate terminal coupled to the WL and one of a source or drain terminal coupled to a second bit-line (BLB), wherein the BLB is to provide a signal which is inverse of a signal on BL;
        a first non-volatile structure coupled to one of the drain or source of the first transistor, and further coupled to a plate-line (PL); and
        a second non-volatile structure coupled to one of the drain or source of the second transistor, and further coupled to the PL;
        wherein each of the first and second non-volatile structures comprises:
            a first layer comprising a first refractive inter-metallic material, wherein the first layer is adjacent to the drain or source of the first or second transistor;
            a second layer comprising a first conductive oxide, wherein the second layer is adjacent to the first layer;
            a third layer comprising a perovskite material, wherein the third layer is adjacent to the second layer;

a fourth layer comprising a second conductive oxide, wherein the fourth layer is adjacent to the third layer;
a fifth layer comprising a second refractive inter-metallic material, wherein the fifth layer is adjacent to the PL and adjacent to the fourth layer;
a sixth layer directly adjacent to first sides of the first, second, third, fourth and fifth layers; and
a seventh layer directly adjacent to second sides of the first, second, third, fourth and fifth layers, wherein the sixth and the seventh layers comprise a barrier material.

13. The system of claim 12, wherein the first and second transistors are of a same conductivity type, and wherein the first and second transistors are one of planar transistors or non-planar transistors.

14. The system of claim 12, wherein:
the barrier material includes one or more of an oxide of: Ti, Al, or Mg;
the perovskite material is doped with La or Lanthanides;
the refractive inter-metallic material includes one or more of: Ti, Al, Ta, W, or Co; and
the first or second conductive oxides include oxides of one or more of: Ir, Ru, Pd, Ps, or Re.

15. The system of claim 12, wherein the first and second transistors are positioned in a backend of a die, or wherein the first and second transistors are positioned in a frontend of the die.

16. The system of claim 12, wherein the perovskite material includes one of: LaCoO3, SrCoO3, SrRuO3, LaMnO3, SrMnO3, YBa2Cu3O7, Bi2Sr2CaCu2O8, or LaNiO3.

17. The system of claim 12, wherein the perovskite material includes one of: La, Sr, Co, Ru, Mn, Y, Na, Cu, or Ni.

18. A method for forming a differential bit-cell, the method comprising:
fabricating a first transistor having a gate terminal coupled to a word-line (WL) and one of a source or drain terminal coupled to a first bit-line (BL);
fabricating a second transistor having a gate terminal coupled to the WL and one of a source or drain terminal coupled to a second bit-line (BLB), wherein the BLB is to provide a signal which is inverse of a signal on BL;
forming a first ferroelectric structure coupled to one of the drain or source of the first transistor, and further coupled to a plate-line (PL); and
forming a second ferroelectric structure coupled to one of the drain or source of the second transistor, and further coupled to the PL, wherein the first and second ferroelectric structures comprise a perovskite material;
wherein forming the first or second ferroelectric structures comprises:
forming a first layer comprising a first refractive inter-metallic material, wherein the first layer is adjacent to the drain or source of the first or second transistor;
forming a second layer comprising a first conductive oxide, wherein the second layer is adjacent to the first layer;
forming a third layer comprising a perovskite material, wherein the third layer is adjacent to the second layer;
forming a fourth layer comprising a second conductive oxide, wherein the fourth layer is adjacent to the third layer;
forming a fifth layer comprising a second refractive inter-metallic material, wherein the fifth layer is adjacent to the PL and adjacent to the fourth layer;
forming a sixth layer adjacent to a first side of the first, second, third, fourth and fifth layers;
forming a sixth layer directly adjacent to first sides of the first, second, third, fourth and fifth layers; and
forming a seventh layer directly adjacent to second sides of the first, second, third, fourth and fifth layers, wherein the sixth and the seventh layers comprise a barrier material.

19. The method of claim 18, wherein:
the barrier material includes one or more of an oxide of: Ti, Al, or Mg;
the first and/or second transistor is one of a planar or non-planar transistor;
the perovskite material is doped with La or Lanthanides;
the refractive inter-metallic material includes one or more of: Ti, Al, Ta, W, or Co; and
the first or second conductive oxides include oxides of one or more of: Ir, Ru, Pd, Ps, or Re.

20. The method of claim 18 comprising positioning the first and second transistors in a backend of a die.

21. The method of claim 18 comprising positioning the first and second transistors in a frontend of a die.

22. The method of claim 18, wherein the perovskite material includes one of: LaCoO3, SrCoO3, SrRuO3, LaMnO3, SrMnO3, YBa2Cu3O7, Bi2Sr2CaCu2O8, or LaNiO3.

23. The method of claim 18, wherein the perovskite material includes one of: La, Sr, Co, Ru, Mn, Y, Na, Cu, or Ni.

24. The method of claim 18, wherein the first and second transistors are of a same conductivity type.

* * * * *